United States Patent [19]

Shimohigashi et al.

[11] Patent Number: 5,119,332
[45] Date of Patent: Jun. 2, 1992

[54] SEMICONDUCTOR MEMORY

[75] Inventors: Katsuhiro Shimohigashi, Murashimurayama; Hiroo Masuda, Kodaira; Hiroshi Kawamoto, Kodaira, all of Japan

[73] Assignee: Hitachi, Ltd., Tokyo, Japan

[21] Appl. No.: 515,345

[22] Filed: Apr. 30, 1990

Related U.S. Application Data

[60] Continuation of Ser. No. 397,119, Aug. 22, 1989, abandoned, which is a continuation of Ser. No. 230,046, Aug. 9, 1988, Pat. No. 4,860,255, which is a continuation of Ser. No. 120,539, Nov. 13, 1987, , which is a division of Ser. No. 941,840, Dec. 15, 1986, Pat. No. 4,709,353, which is a division of Ser. No. 854,502, Apr. 22, 1986, Pat. No. 4,646,267, which is a division of Ser. No. 756,707, Jul. 19, 1985, Pat. No. 4,592,022, which is a division of Ser. No. 638,982, Aug. 8, 1984, Pat. No. 4,539,658, which is a division of Ser. No. 377,958, May 13, 1982, Pat. No. 4,472,792.

[30] Foreign Application Priority Data

May 13, 1981 [JP] Japan .................. 56-707733

[51] Int. Cl.⁵ .......................... G11C 11/40
[52] U.S. Cl. .................. 365/189.01; 365/189.05; 365/186; 365/205
[58] Field of Search ........ 365/189.01, 189.05, 365/189.07, 205, 186, 190, 149

[56] References Cited

U.S. PATENT DOCUMENTS

| | | | |
|---|---|---|---|
| 3,760,380 | 9/1973 | Hoffmann et al. | 365/189 |
| 3,983,544 | 9/1976 | Dennison et al. | 365/189 |
| 3,983,545 | 9/1976 | Cadaro | 365/154 |
| 4,133,049 | 1/1979 | Shirato | 365/207 |
| 4,223,394 | 9/1980 | Pathak et al. | 365/207 |
| 4,367,540 | 1/1983 | Shimohigashi | 365/207 |
| 4,417,328 | 11/1983 | Ochii | 365/203 |
| 4,441,171 | 4/1984 | Hoffmann | 365/205 |
| 4,507,759 | 3/1985 | Yasui et al. | 365/189 |

Primary Examiner—Terrell W. Fears
Attorney, Agent, or Firm—Antonelli, Terry Stout & Kraus

[57] ABSTRACT

A dynamic RAM integrated circuit of the one-element memory cell type is provided with a plurality of data lines, a sense amplifier, a plurality of word lines disposed in a manner to intersect with the data lines, and memory cells disposed at the points of intersection between the data lines and the word lines. The RAM includes a P-type semiconductor substrate and an N-type well region formed in the substrate. The memory cells are disposed within the well, and the sense amplifier, which is connected to the date lines, is constructed to a pair of N-channel MOSFETs formed in the semiconductor substrate and a pair of P-channel MOSFETs formed in the well region.

24 Claims, 23 Drawing Sheets

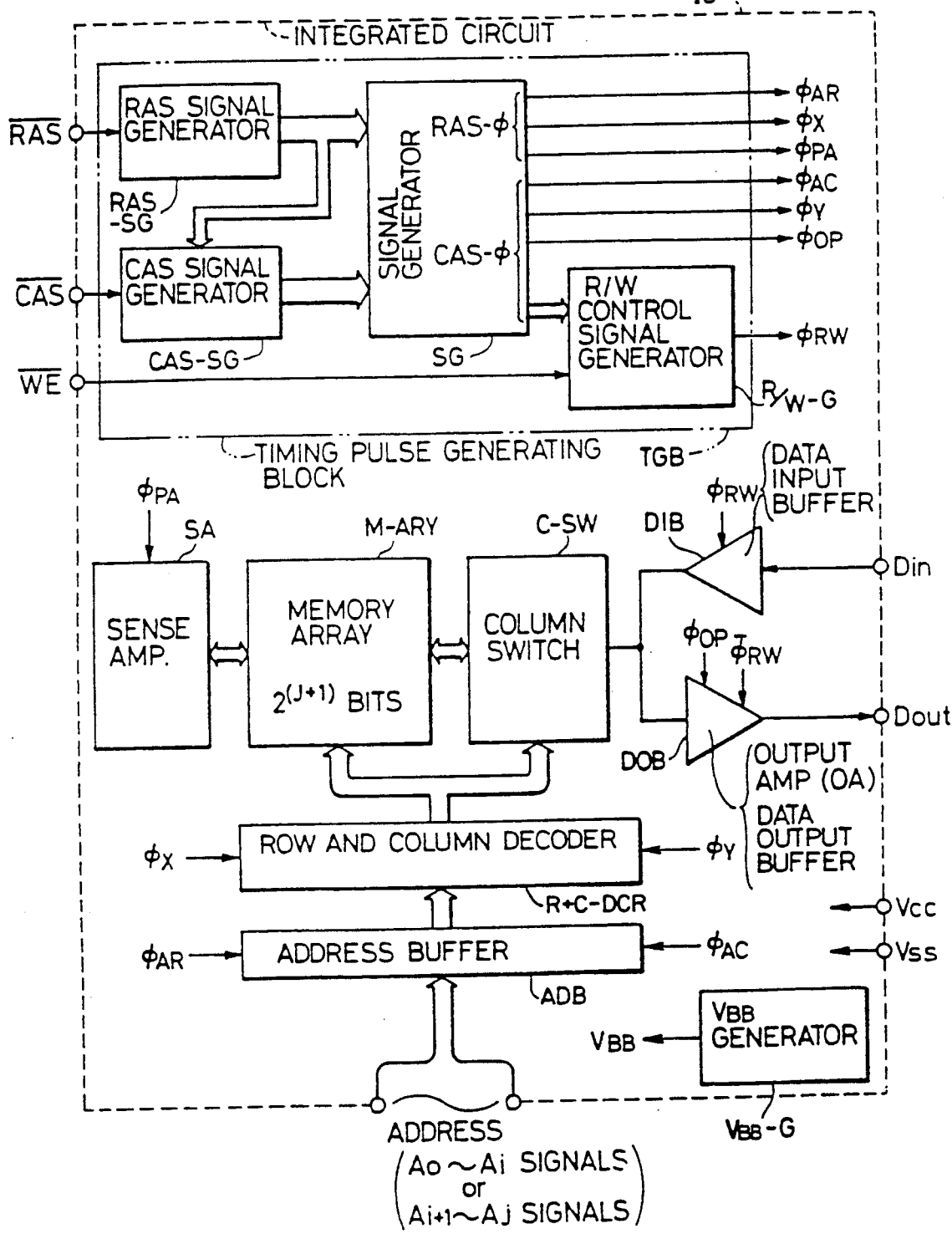

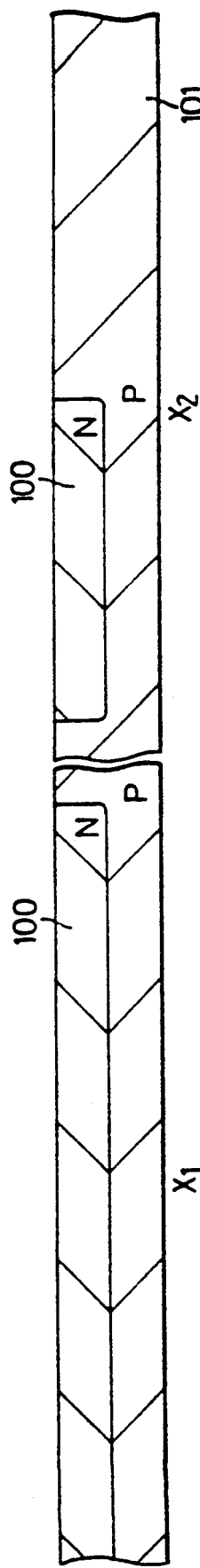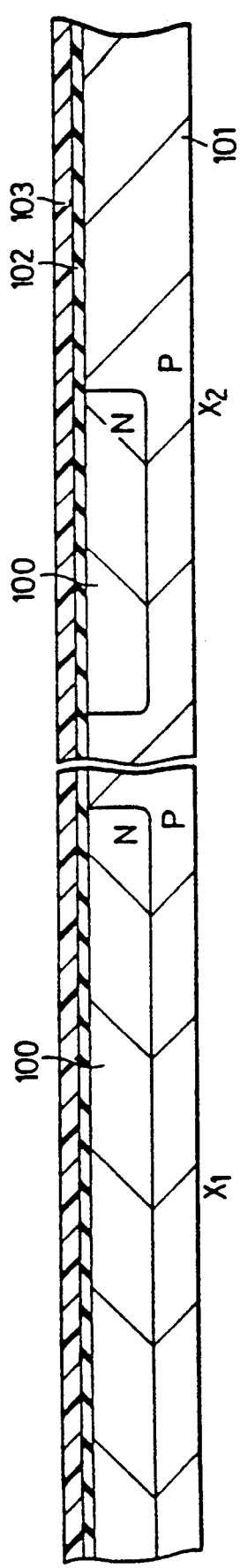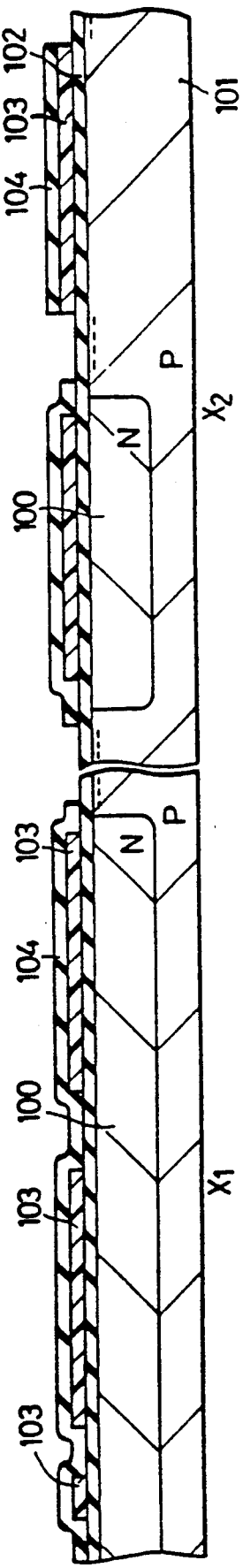
FIG. 16
FIG. 17
FIG. 18

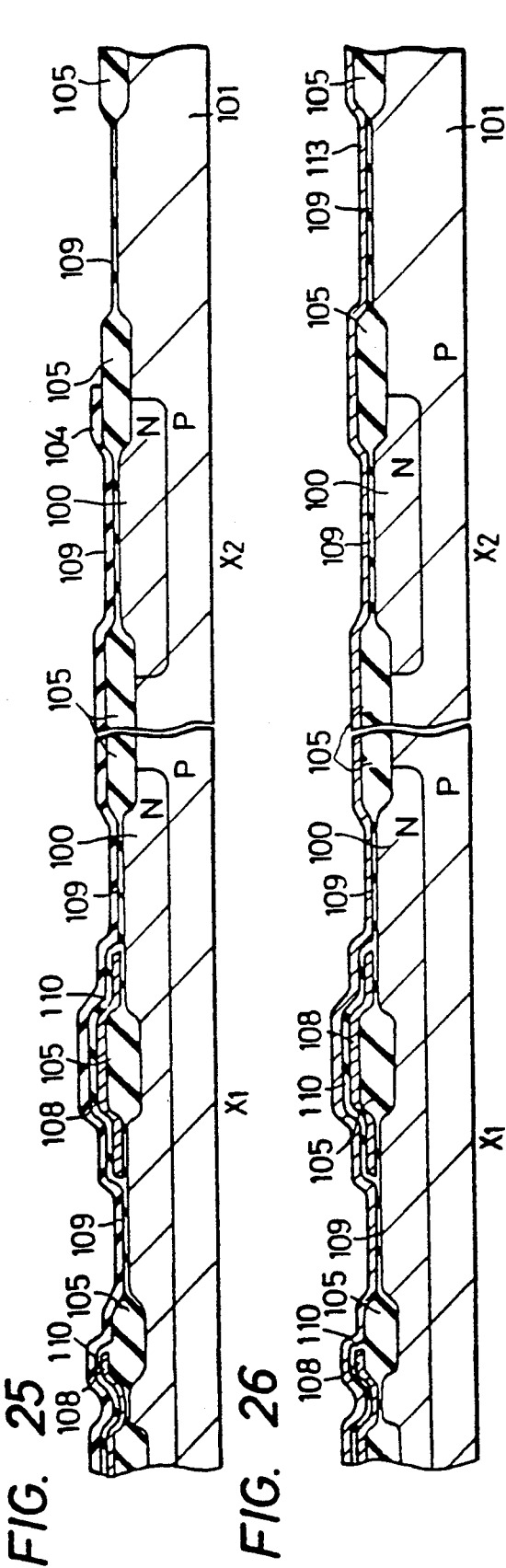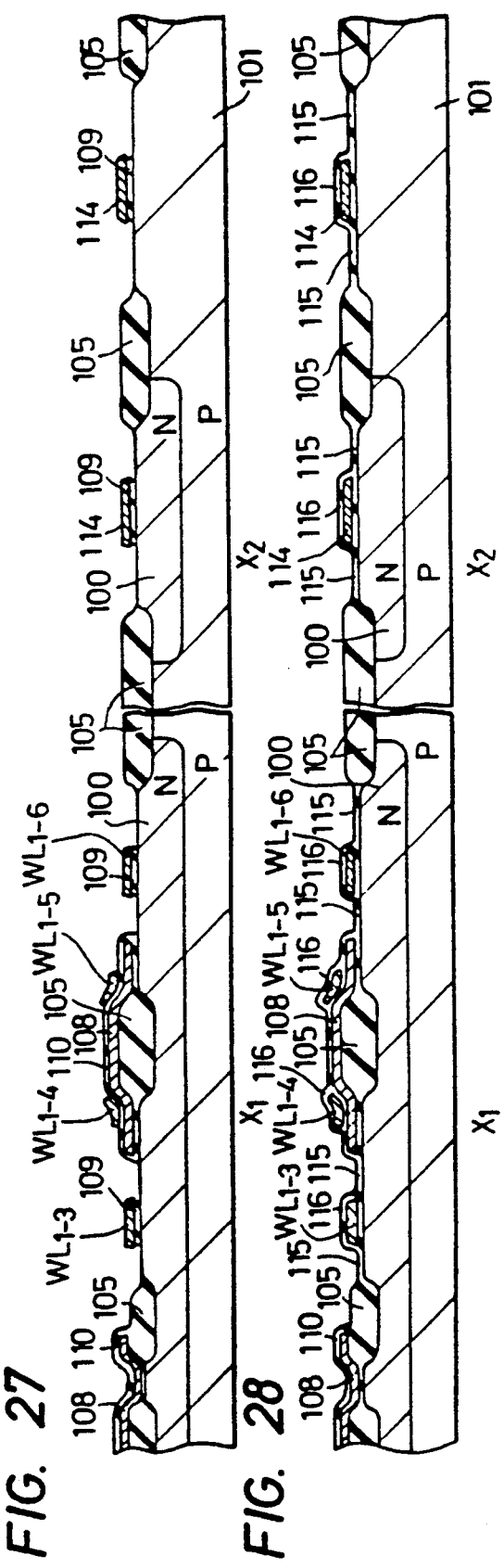
FIG. 25
FIG. 26
FIG. 27
FIG. 28

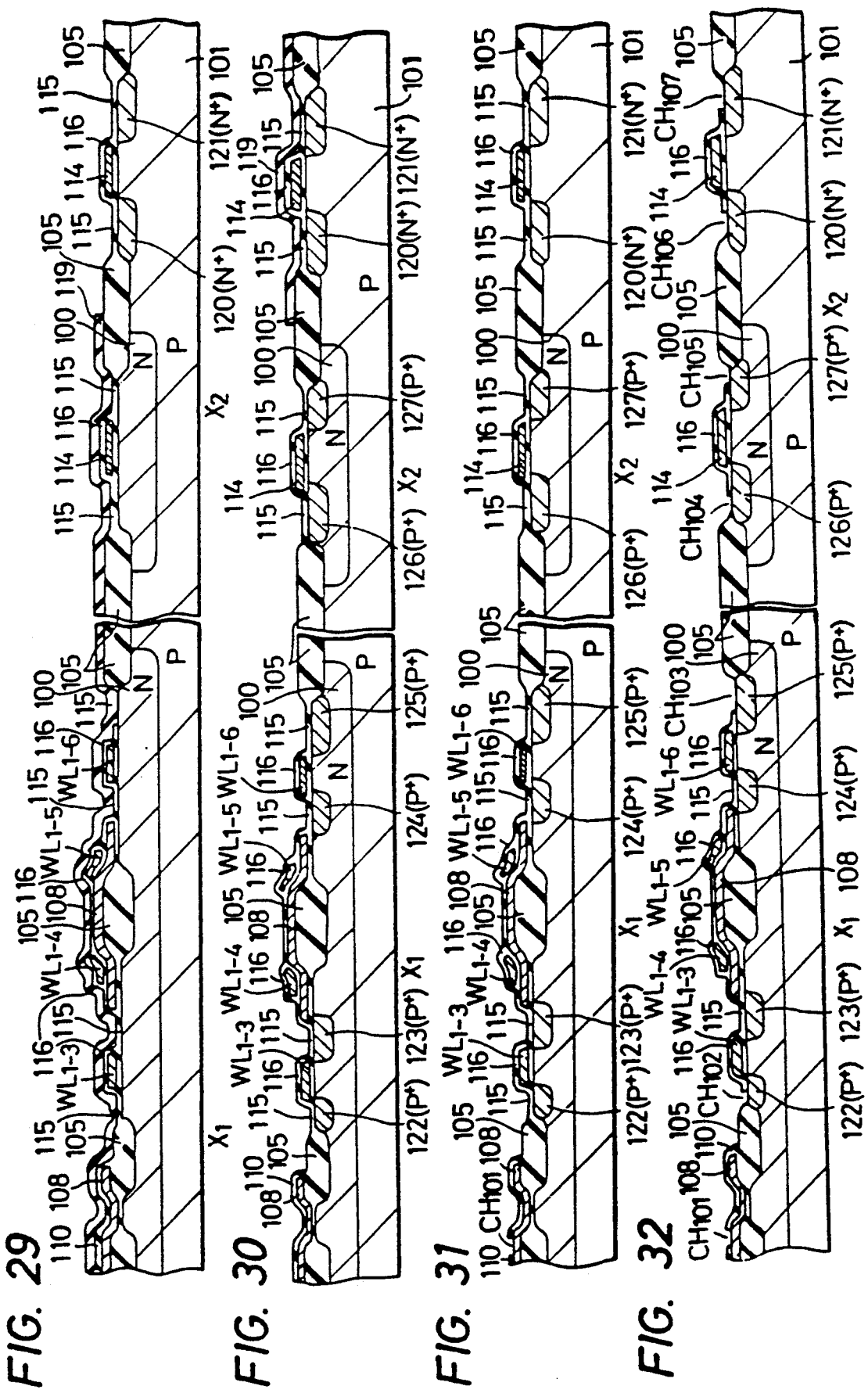

SEMICONDUCTOR MEMORY

This application is a continuation of application Ser. No. 397,119 filed Aug. 22, 1989, now abandoned, which is a continuation of application Ser. No. 230,046, filed Aug. 9, 1988, now U.S. Pat. No. 4,860,255, which is a continuation of application ser. No. 120,539 filed Nov. 13, 1987, now abandoned, which is a division of application Ser. No. 941,840 filed Dec. 15, 1986, now U.S. Pat. No. 4,709,353, which is a division of application Ser. No. 854,502 filed Apr. 22, 1986, now U.S. Pat. No. 4,646,267, which is a division of application Ser. No. 756,707 filed Jul. 19, 1985, now U.S. Pat. No. 4,592,022, which is a division of application Ser. No. 638,982 filed Aug. 8, 1984, now U.S. Pat. No. 4,539,658, which is a division of application Ser. No. 377,958 filed May 13, 1982, now U.S. Pat. No. 4,472,792.

BACKGROUND OF THE INVENTION

This invention relates to a semiconductor memory. More particularly, it relates to a semiconductor memory which is constructed of MISFETs (Metal-Insulator-Semiconductor Field Effect Transistors) represented by MOSFETs (Metal-Oxide-Semiconductor Field Effect Transistors) (hereinbelow, abbreviated to "MOS").

Hereunder, a P-channel MOSFET and an N-channel MOSFET will be respectively called "P-MOS" and "N-MOS", and a complementary MOSFET with both the MOSFETs combined will be called "CMOS". A pair of data lines connected to a sense amplifier to be in parallel with each other will be referred to as "folded data lines".

The so-called one-element memory cell which is constructed of one MOSFET and one capacitor requires only a small number of elements and wirings, and therefore has the merit that the area occupied by the memory cell is quite small compared to other memory cell arrangements. For this reason, semiconductor memories employing one-element type memory cells are being put into extensive use for dynamic RAMs having a large memory capacity.

Since the performance of a sense amplifier in the dynamic RAM is greatly influential on the operation margin of the memory, the design of the sense amplifier is extremely important in the circuit design of a one-element type memory cell system. In addition, the sense amplifier must be efficiently formed in one semiconductor substrate together with the memory cells using semiconductor integrated circuit technology in such a manner that it will not occupy a large area.

On the other hand, in the dynamic RAM, the structure of the memory cell must be arranged to prevent soft errors which can result from α-particles (alpha-particles). Further, when integrated to be unitary with the sense amplifier, the memory cell is required to have high speed information read-out capabilities.

SUMMARY OF THE INVENTION

The principal object of this invention is to enhance the performances of a dynamic RAM which is constructed of one-element type memory cells, owing to a specific combination between the structure of a sense amplifier and the structure of the memory cell.

Another object of this invention is to provide a semiconductor memory which can reduce the probability of soft errors ascribable to α-particles (alpha-particles).

Another object of this invention is to provide a sense amplifier in which output potentials close to respective predetermined power source voltages are produced for both read-out information of logic "1" and read-out information of logic "0" in stable states during sensing operations.

Another object of this invention is to provide a semiconductor memory in which the aforecited stable operating sense amplifier and memory cells having a low susceptibility to soft errors due to α-particles are fabricated by an identical manufacturing process.

Another object of this invention is to provide a semiconductor memory which can raise the read-out speed of information from memory cells and which can reduce the power dissipation.

Another object of this invention is to provide a novel semiconductor memory capable of reducing noise in which the aforecited stable operating sense amplifier is connected to folded data lines.

Another object of this invention is to provide a small-sized semiconductor memory in which a complementary sense amplifier is connected to folded data lines so as to make the chip layout efficient.

According to the fundamental construction of this invention, the memory array or memory mat of one-element type memory cells is formed in a well region disposed in a semiconductor substrate, and a sense amplifier is arranged in a CMOS circuit form, some of the circuit elements of the sense amplifier being also formed in the well region in which the memory mat is formed, or in another well region.

The characterizing features of a dynamic RAM according to this invention reside in the following:

(1) In accordance with this invention, there is provided a semiconductor memory in which a plurality of N-type well regions formed by an identical process are disposed in a P-type semiconductor substrate and in which P-channel MISFETs serving as memory cells and a pair of P-channel FETs constituting a complementary sense amplifier are formed in the surfaces of the respective well regions. Due to such a memory arrangement, memory cells having a reduced susceptibility to soft errors due to α-particles and a high speed, stable sense amplifier are simultaneously obtained using conventional complementary MOS IC manufacturing techniques.

As a result of this, by constructing the memory cell of P-MOSFETs and varying a word voltage within a range between a power source voltage $V_{cc}$ and ($V_{cc} - |V_{thp}|$), the selection of information "1" or "0" is permitted, and a memory capable of operating at high speed is obtained.

(2) In accordance with this invention, there is provided a semiconductor memory in which a complementary sense amplifier is connected to folded data lines. According to such a memory arrangement, an areal margin in layout which is approximately double that of prior art arrangements appears in the pitch direction of data lines. Thus, a high packaging density is possible.

(3) In accordance with this invention, there is provided a semiconductor memory which comprises means for precharging folded data lines to a potential intermediate between the logic levels "1" and "0" of a memory cell. According to such a memory arrangement, the change of the potential of a data line equal to half of the potential difference between the logic levels "1" and "0" determines a read-out time, so that a memory of high speed and low power dissipation is obtained.

In addition, the coupling noise of a word line and the data line are cancelled because plus and minus noises develop in the folded data lines respectively.

Further, since the data line is precharged to a reference potential level which is intermediate between the logic levels "1" and "0" of the memory cell, a dummy cell can be dispensed. This permits significant reductions in chip size.

(4) In accordance with this invention, the starting times of the positive feedback operation of the P-channel FET pair of a sense amplifier and the positive feedback operation of the N-channel FET pair thereof are made different, so that through-current does not flow. As a result, a memory of lower power dissipation is obtained.

(5) In accordance with this invention, there is provided a semiconductor memory in which the P-channel FET pair and N-channel FET pair of a complementary sense amplifier are arranged at both the ends of a memory array. According to this arrangement, the layout within a chip can be separated into the group of P-channel FETs and the group of N-channel FETs. This permits efficient packaging.

(6) In accordance with this invention, the folded data lines are formed of aluminum (Al), so that a very low wiring resistance is exhibited. This enhances the operational reliability.

(7) In accordance with this invention, there is provided a semiconductor memory in which an N-type well region for forming memory cells therein is made as an epitaxial structure. According to such an arrangement, a uniform well having a desired impurity concentration can be obtained. As a result, the threshold voltage can be better controlled and the junction capacitance can be made lower than in a case where diffusion is used. This improves the high speed capabilities of the memory. In addition, the surface impurity concentration of the well can be made lower than in the case of diffusion, so that a memory having a high breakdown voltage is obtained.

(8) In accordance with this invention, there is provided a semiconductor memory in which a plurality of N-type well regions are formed with well biasing wirings in parallel with data lines. According to such a memory arrangement, well voltages become substantially uniform and well resistances can be made low. This improves the immunity of the memory to noise.

(9) Finally, in accordance with this invention, there is provided a semiconductor memory in which the well region forming the memory cells and the well region forming the sense amplifier are isolated. According to such memory, noise which is developed in the sense amplifier has no influence on the memory cells. Thus, a highly reliable operation is permitted.

Hereunder, the embodiments of a dynamic RAM according to this invention will be described with reference to the drawings.

BRIEF DESCRIPTION OF THE DRAWINGS

FIG. 2 is a block diagram of a D-RAM from the array shown in FIG. 1;

FIGS. 10 to 35 are sectional views of a C-MOS dynamic RAM showing the respective steps of a manufacturing process thereof.

DESCRIPTION OF THE PREFERRED EMBODIMENTS

Figure 1:
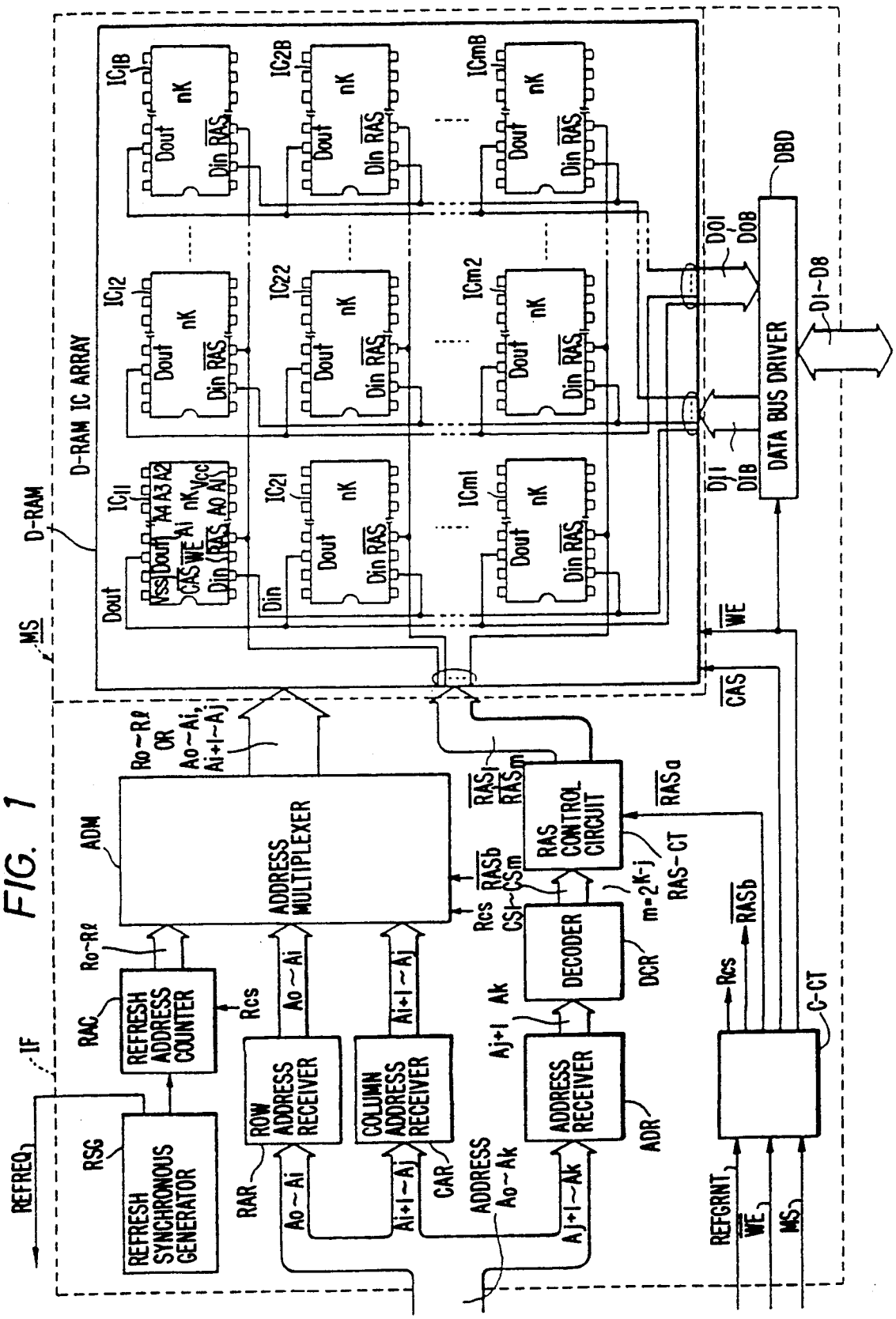
FIG. 1 is a diagram of a memory system utilizing a dynamic RAM (D-RAM) array according to this invention.

Embodiments in which this invention is applied to a dynamic RAM employing one-element type memory cells will now be described with reference to the drawings.

Construction and Operation of the Dynamic Memory System of the Invention

The construction of a dynamic memory system will be explained with reference to FIG. 1. First, a block diagram MS enclosed with a dotted line indicates a dynamic memory system. This system is constructed of a D-RAM IC ARRAY portion in which a plurality of IC chips $IC_{11}$–$IC_{mB}$ of a D-RAM set up in accordance with the present invention are arrayed (hereinbelow, termed "D-RAM"), a central processing unit portion of a computer (not shown, and hereinbelow, termed "CPU"), and an interface circuit IF between the CPU and the D-RAM.

Next, input and output signals between the dynamic memory system and the CPU will be explained. Address signals $A_0$-$A_k$ are signals for selecting the address of the D-RAM. REFGRNT denotes a refresh grant signal for refreshing the memory information of the D-RAM. $\overline{WE}$ denotes a write enable signal, which is a read-out and write-down instruction signal for data in the D-RAM. MS denotes a memory start signal for starting the memory operation of the D-RAM. $D_1$–$D_8$ designate input/output data on a data bus which couples the CPU and the D-RAM. REFREQ designates a refresh request signal for the memory information of the D-RAM.

The dynamic memory system will now be explained separately for the D-RAM and the interface circuit (IF). The D-RAM is made up of an IC array which is constructed according to the present invention into a matrix arrangement of (n x m) words x B bits in such a way that n.kbit integrated circuits received in individual IC packages (hereinbelow, termed "nk", noting that 1 kbit indicates $2^{10} = 1024$ bits) are arrayed in a number m in each column and in a number B in each row.

The interface circuit IF will first be described. Referring, then, to the interface IF, RAR designates a row address receiver which receives the address signals $A_0$ - $A_i$ among the address signals $A_0$ - $A_k$ transmitted from the CPU and which converts them into address signals with timings adapted to the operation of the D-RAM. CAR designates a column address receiver which receives the address signals $A_{i+1}$ - $A_j$ among the address signals $A_0$ - $A_k$ and which converts them into address signals with timings adapted to the operation of the D-RAM.

ADR indicates an address receiver which receives the address signals $A_{j+1}$ - $A_k$ among the address signals $A_0$ - $A_k$ and which converts them into address signals with timings adapted to the operation of the D-RAM.

DCR indicates a decoder which transmits a chip selection control signal for selecting the chip of the D-RAM (hereinbelow, termed "$CS_l$ - $CS_m$" where $m = 2^{k-j}$).

RAS-CT represents a RAS control circuit which transmits a chip selection signal and a row address introducing signal having timings adapted to the operation of the D-RAM.

ADM represents an address multiplexer which multiplexes the address signals $A_0$ - $A_i$ and $A_{i+1}$ - $A_j$ in time sequence and then transmits them to the D-RAM.

RSG represents a refresh synchronous generator which determines a timing for refreshing the memory information of the D-RAM.

RAC represents a refresh address counter which transmits refresh address signals $R_0$ - $R_l$ in order to refresh the memory information of the D-RAM.

DBD denotes a data bus driver whose data input and output operations between the CPU and the D-RAM are switched by the $\overline{WE}$ signal.

C-CT denotes a control circuit which transmits signals for controlling the above-mentioned RAC, ADM, RAS-CT, DBD and D-RAM.

Now, the actions of the address signals within the dynamic memory system will be described.

The address signals $A_0$ - $A_k$ which rae transmitted from the CPU are divided into the two functions of the address signals $A_0$ - $A_j$ and the address signals $A_{j+1}$ - $A_k$ within the dynamic memory system. More specifically, the address signals $A_0$ - $A_j$ are used as the address signals of memory matrices within the respective chips of the D-RAM. On the other hand, the address signals $A_{j+1}$ - $A_k$ become the chip selection signal which, when viewed from the IC chip of the D-RAM, determines whether or not the entire chip is selected.

Herein, in conformity with the matrix within the IC chip of the D-RAM, the address signals $A_0$ - $A_j$ are so designed that the address signals $A_0$ - $A_i$ are allotted to the selection of the row of the IC chip array, while those $A_{i+1}$ - $A_j$ are allotted to the selection of the column of the IC chip array.

Now, circuit operations within the dynamic memory system will be described.

$\overline{RAS}$ signals, i.e., $\overline{RAS}_1$ - $\overline{RAS}_m$ signals, a $\overline{RAS}_a$ signal and a $\overline{RAS}_b$ signal, are row address strobe signals, while a $\overline{CAS}$ signal is a column address strobe signal. The address signals $A_0$ - $A_i$ and those $A_{i+1}$ - $A_j$ are respectively applied to the ADM through the RAR and CAR. When the $\overline{RAS}_b$ signal has become a certain level, the row address signals $A_0$ - $A_i$ are transmitted from the ADM and applied to the address terminals of the D-RAM. At this time, the column address signals $A_{i+1}$ - $A_j$ are prevented from being transmitted.

Next, when the $\overline{RAS}_b$ signal has become the opposite level to that mentioned above, the column address signals $A_{i+1}$ - $A_j$ are transmitted from the ADM and applied to the address terminals. At this time, the row address signals $A_0$ - $A_i$ are prevented from being transmitted from the ADM.

In this way, the address signals $A_0$ - $A_i$ and $A_{i+1}$ - $A_j$ are applied to the address terminals of the D-RAM in time sequence in accordance with the levels of the $\overline{RAS}_b$ signal.

Since a refresh control signal $R_{cs}$ is applied to neither the ADM nor the RAC, the refresh address signals $R_0$ - $R_l$ are not transmitted from the ADM.

The chip selection signals $A_{j+1}$ - $A_k$ are converted through the DCR into the chip selection control signals $CS_l$ - $CS_m$ ($m = 2^{k-j}$) which principally select the chips within the D-RAM. The converted signals are further converted into the $\overline{RAS}_1$ - $\overline{RAS}_m$ signals whose timings have been controlled by the $\overline{RAS}_a$ signal and which re used as the chip selecting signals and the row address introducing signals.

There will now be explained the operation of setting addresses within the chips in each column of the D-RAM.

First, the row address signals $A_0$ - $A_i$ are applied to the address terminals of all the IC chips of the D-RAM. It is assumed that when one of the $\overline{RAS}_1$ - $\overline{RAS}_m$ signals, for example, the $\overline{RAS}_l$ signal has thereafter become a certain level, the ICs numbering B which are located in the uppermost stage are selected. At this time, the row address signals $A_0$ - $A_i$ are introduced into the row addresses of the memory matrix arrays within the IC ($IC_{11}$, $IC_{12}$, . . . $IC_{1B}$) chips. Here, the reason why the row address signals $A_0$ - $A_i$ are applied to the ICs in advance of the $\overline{RAS}_l$ signal is that, when the $\overline{RAS}_l$ signal is applied before the row address signals $A_0$ - $A_i$, signals other than the row address signals might be introduced.

Subsequently, the column address signals $A_{i+1}$ - $A_j$ are applied to the address terminals of all the IC chips of the D-RAM. Thereafter, when the $\overline{CAS}$ signal delayed with respect to the $\overline{RAS}_l$ signal has become a certain level, the column address signals $A_{i+1}$ - $A_j$ are introduced into the column addresses of the memory matrix arrays within the B IC chips of n·k bits located in the uppermost stage. Here, the reason why the column address signals $A_{i+1}$ - $A_j$ are applied to the ICs in advance of the $\overline{CAS}$ signal is the same as the aforecited reason. The action of the $\overline{CAS}$ signal is to distinguish which signals are being sent between the row address signals $A_0$ - $A_i$ and the column address signals $A_{i+1}$ - $A_j$.

By the above operation, the addresses within the B nk chips in the uppermost stage of the D-RAM have been set. The ICs other than those in the uppermost stage of the D-RAM are not selected because the $\overline{RAS}_2$ - $\overline{RAS}_m$ signals are at the opposite level to the level of $\overline{RAS}_1$.

Now, the write-down operation and read-out operation of data in the set addresses will be explained.

The D-RAM is so designed that the write-down operation and read-out operation of data are determined by the high level or low level of the write enable signal (hereinafter, termed "$\overline{WE}$ signal"). The write-down operation is executed in such a way that when the $\overline{WE}$ signal is at a certain level, data $D_{II}$ - $D_{IB}$ from the CPU are applied to the set addresses. The read-out operation is executed in such a way that when the $\overline{WE}$ signal is at the opposite level to the above, the data $D_{O1}$ - $D_{OB}$ of the respective addresses having been written down are delivered at B bits.

Actions of the Control Signals of FIG. 1

In FIG. 1, abbreviations signify the actions of signals. For example, an abbreviation over which an inversion symbol (bar) is placed indicates that when the signal is "0" (Low Level), the action signified by the abbreviation is executed. On the other hand, an abbreviation without the bar symbol indicates that when the signal is at "1" (High Level), the action is executed.

The C-CT receives instruction signals from the CPU, i.e., the REFGRNT signal, $\overline{WE}$ signal and MS signal, and delivers the $\overline{CAS}$ signal, $\overline{RAS}_a$ signal, $\overline{RAS}_b$ signal, $\overline{WE}$ signal and $R_{cs}$ signal in response thereto. The actions of these delivered control signals will now be explained.

The $\overline{CAS}$ signal is the signal for distinguishing which of the row address signals $A_0$ - $A_i$ and the column address signals $A_{i+1}$ - $A_j$ are being transmitted to the respective chips within the D-RAM. It is also the signal for introducing the column address signals of the IC chips.

The $\overline{RAS}_a$ signal is the signal for adjusting the timings of the $CS_l$ - $CS_m$ signals and supplying the adjusted signals to the IC chip array within the D-RAM.

The $\overline{WE}$ signal is the signal for determining the read-out of data from the memory cells within the IC chips of the D-RAM and the write-down of data into the memory cells.

The $R_{cs}$ signal is the signal for starting the refresh operation. It can also inhibit the ADM from transmitting the address signals $A_0$ - $A_i$ and $A_{i+1}$ - $A_j$ and while simultaneously permitting it to transmit the refresh address signals $R_0$ - $R_l$ from the RAC.

The $\overline{RAS}_b$ signal is the switching timing signal for converting the row address signals $A_0$ - $A_i$ and column address signals $A_{i+1}$ - $A_j$ from the ADM into the time-sequential multiplexed signals. In addition, it is made a signal according to which the time of the switching between the row address signals $A_0$ - $A_i$ and the column address signals $A_{i+1}$ - $A_j$ is delayed with respect to the $RAS_a$ signal so that the row address signals $A_0$ - $A_i$ can be provided from the ADM when one of the $\overline{RAS}$ ($\overline{RAS}_l$ - $\overline{RAS}_m$) signals is selected.

Next, the relationship between the $\overline{WE}$ signal and the data bus driver (DBD) will be described.

The $\overline{WE}$ signal transmitted from the C-CT is applied to the D-RAM and the DBD. By way of example, when the $\overline{WE}$ signal is at the high level, the read-out mode is established, and the data of the D-RAM are provided and transmitted to the CPU through the DBD. At this time, input data are controlled by the $\overline{WE}$ signal so as not to be introduced from the DBD into the D-RAM. When the $\overline{WE}$ signal is at the low level, the write-down mode is established, and the input data are applied from the CPU through the DBD to the data input terminals of the D-RAM and are written into the set addresses. At this time, the data outputs of the D-RAM are controlled by the $\overline{WE}$ signal so as not to be provided from the DBD.

Refresh Operation

In the memory cell circuit of the D-RAM, information is retained by accumulating charges in the MOS capacitor of the one-element type memory cell. However, as is well known, the charges disappear with time due to leakage current. Obviously, this presents the problem that when the charges of the information "1" (High Level) have reduced to a point of being less than a reference level for discriminating the information "1" and "0", the information "1" is discriminated as "0", resulting in a malfunction. Thus, in order to keep the information "1" stored, the charges need to be refreshed before they decrease below the reference level. This refresh operation needs must be carried out within the information storage time of the memory cell. Accordingly, the refresh mode has preference to the read-out mode and the write-down mode.

The refresh operation will now be explained with reference to FIG. 1.

The refresh synchronous generator RSG transmits the refresh request signal REFREQ to the CPU every period of (information storage time)/(number of refresh cycles). The number of refresh cycles is equivalent to the number of word lines connected to a column data line.

Upon receiving the REFREQ, the CPU transmits the refresh grant signal REFGRNT. At this time, neither the write enable signal $\overline{WE}$ nor the memory start signal MS is transmitted from the CPU. When the REFGRNT is applied to the control circuit C-CT, the refresh control signal $R_{cs}$ being the output signal thereof is applied to the address multiplexer ADM and the refresh address counter RAC. Then the ADM responds to the $R_{cs}$ signal to send the address signals $R_0$ - $R_l$, which are exclusively for refreshing, to the D-RAM in place of the address signals for random access $A_0$ - $A_j$.

There are two broad categories of refreshing methods in the D-RAM. One of them is a method in which the respective rows of the IC chip array ($IC_{11}$, $IC_{12}$, ... and $IC_{1B}$ constitute one row) are refreshed by turns. This method has the advantage that the power dissipation required for the refresh operation is generally low. However, it suffers from the disadvantage that the period of time required for the refresh operation is long.

The other method is a method in which the whole IC chip array of the D-RAM is simultaneously refreshed. This method performs the refresh in such a manner that, although no illustration is made in FIG. 1, the address signals $A_{j+1}$ - $A_k$ from the address receiver ADR are applied to the RAS control circuit RAS-CT without passing through the decoder DCR, so that all the output signals $\overline{RAS}_l$ - $\overline{RAS}_m$ of the RAS-CT become a certain level, and the ICs of all the columns of the D-RAM are selected at the same time. The advantage of this method is that it only requires a short period of time for the refresh operation. On the other hand, it has the disadvantage of high power dissipation.

Now, the refresh operation in the matrix array within the IC of the D-RAM will be explained.

When the refresh address signals $R_0$ - $R_l$ are applied from the ADM to the address terminals of the D-RAM, the $\overline{RAS}$ signal thereafter becomes a certain level, and the $2^{l+1}$ row addresses of the IC matrix array are successively selected. At this time, the $\overline{CAS}$ signal is held at the opposite level to the above. The refresh is accordingly performed in such a manner that the information of the memory cells connected to the selected row addresses are amplified by a sense amplifier (not shown) so as to expand the level difference between "1" and "0". Since the $\overline{WE}$ signal is transmitted to neither the D-RAM nor the DBD during the refresh operation, the input or output operation of data from the DBD is not executed.

Actions of RAS-Group Signals and CAS-Group Signals

The actions of RAS-group signals (hereinafter, termed "RAS-$\phi$") and CAS-group signals (hereinafter, termed "CAS-$\phi$") will now be explained with reference to FIG. 2 which shows a more detailed block diagram of one of the IC chips from FIG. 1.

(1) RAS-$\phi$ Signals $\phi_{AR}$ is an address buffer control signal, which is a signal that is applied to an address buffer ADB to determine whether or not levels $a_0, \overline{a_0}, \ldots$ and $a_i, \overline{a_i}$ corresponding to the row address signals $A_0 - A_i$ which are latched in the ADB are to be transmitted to a row an column decoder R&C-DCR.

$\phi_X$ is a word line control signal, which is a signal that is applied to the R&C-DCR to determine whether or not one selected signal is to be transmitted to a memory array M-ARY in order to select the row address of the M-ARY.

$\phi_{PA}$ is a sense amplifier control signal, which is a signal that is applied to a sense amplifier SA to drive the SA.

(2) CAS-$\phi$ Signals $\phi_{AC}$ is an address buffer control signal, which is a signal that is applied to the ADB to determine whether or not levels $a_{i+1}, \overline{a_{i+1}}, \ldots$ and $a_j, \overline{a_j}$ corresponding to the column address signals $A_{i+1} - A_j$ which are latched in the ADB are to be transmitted to the R&C-DCR.

$\phi_Y$ is a column switch control signal, which is a signal that is applied to the R&C-DCR to select a column switch C-SW connected to the column data line of the M-ARY, by means of one selected signal.

$\phi_{OP}$ is a data output buffer and output amplifier control signal, which is a signal that is applied to a data output buffer DOB and an output amplifier OA to transmit read-out data from the M-ARY to an output data terminal $D_{out}$.

$\phi_{RW}$ is a data input buffer control signal, which is a signal that is applied to a data input buffer DIB to transmit write-down data from an input data terminal $D_{in}$ to the M-ARY.

$\overline{\phi_{RW}}$ is a data output buffer control signal, which is a signal that is applied to the DOB to prevent any data from being delivered to the data output terminal $D_{out}$ during the write-down operation.

Construction and Operation of a D-RAM

The construction of the D-RAM will now be described with reference to FIG. 2. A block enclosed with a dotted line indicates the integrated circuit IC of the D-RAM constructed in accordance with this invention. In the IC, a block enclosed with a two-dot chain line is a timing pulse generating block TBG, which is constructed of circuits for generating the signals to control the operations of the various circuits of the D-RAM.

Figure 3A:
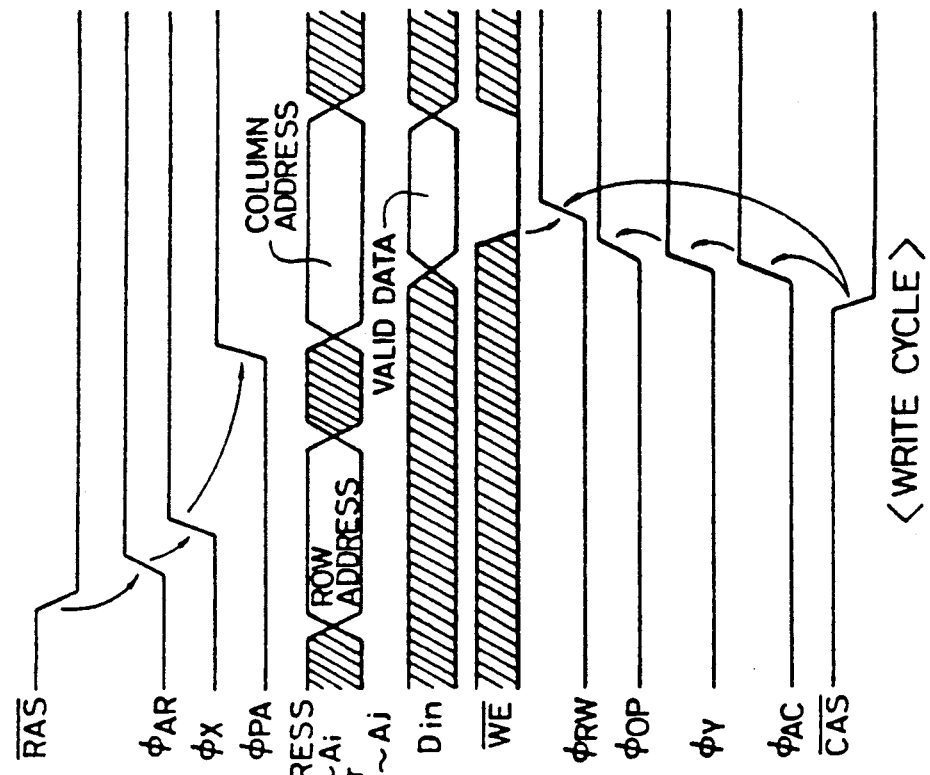
FIGS. 3A and 3B are timing diagrams of the D-RAM of FIG. 2.
Figure 3B:
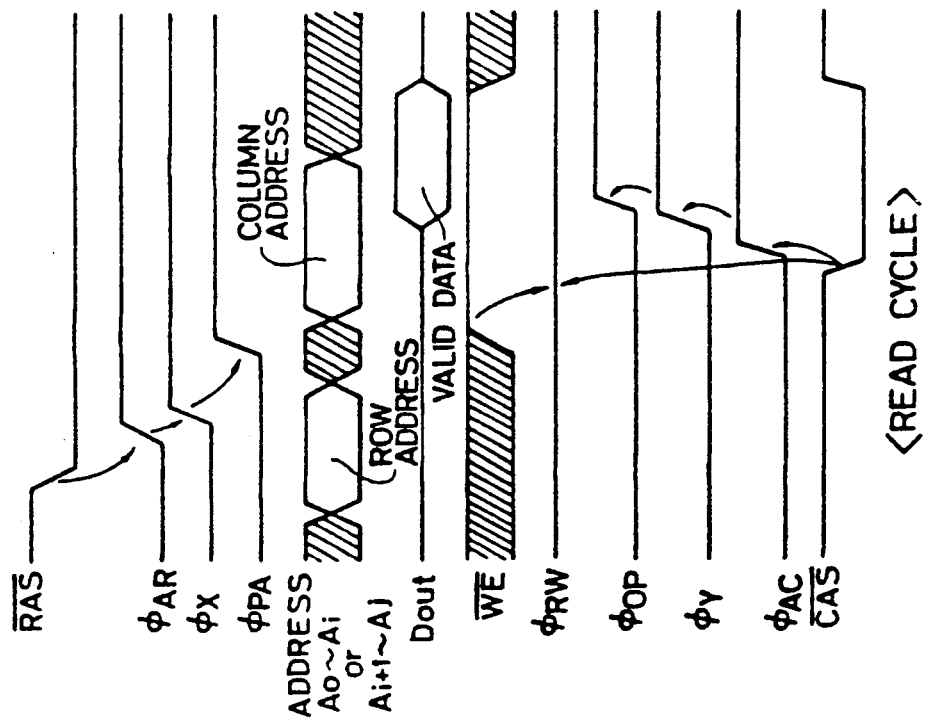

Now, the operations of the various circuits of the D-RAM will be described with reference to FIGS. 3A and 3B.

When the row address signals $A_0 - A_i$ have been introduced into the address buffer ADB and latched therein, the $\overline{RAS}$ signal becomes the low level later than the row address signals $A_0 - A_i$. This measure of making the $\overline{RAS}$ signal later than the row address signals $A_0 - A_i$ is intended to reliably introduce the row address signals $A_0 - A_i$ as the row address in the memory array.

Subsequently, the signal $\phi_{AR}$ delayed from the $\overline{RAS}$ signal is applied to the ADB, so that the levels $a_0, \overline{a_0}, \ldots$ and $a_i, \overline{a_i}$ corresponding to the latched row address signals are transmitted to the row and column decoder R&C-DCR. When the levels $a_0, \overline{a_0}, \ldots$ and $a_i, \overline{a_i}$ have been applied to the R&C-DCR, this R&C-DCR conducts the operation of allowing only selected ones to remain at the high level while placing unselected ones at the low level.

The selected signals are transmitted to the M-ARY when the signal $\phi_X$ delayed from the signal $\phi_{AR}$ is applied to the R&C-DCR. This measure of delaying $\phi_X$ with respect to $\phi_{AR}$ is intended to operate the R&C-DCR after completion of the operation of the ADB. The row address in the M-ARY is thus set in such a manner that, since one of the $2^{i+1}$ output signals of the R&C-DCR becomes the high level, one row address line within the M-ARY which corresponds to it is selected.

Next, the information as to the "1" and "0" states of the memory cells connected to the selected row address line in the M-ARY is respectively amplified by the sense amplifier SA shown in FIG. 2. This operation of the SA starts upon application of the signal $\phi_{PA}$.

Thereafter, when the column address signals $A_{i+1} - A_j$ have been introduced into the ADB and latched therein, the $\overline{CAS}$ signal becomes the low level later than the column address signals $A_{i+1} - A_j$. The measure of making the $\overline{CAS}$ signal later than the column address signals $A_{i+1} - A_j$ is intended to reliably introduce the column address signals as the column address in the memory array.

When the signal $\phi_{AC}$ delayed from the $\overline{CAS}$ signal is subsequently applied to the ADB, the levels $a_{i+1}, \overline{a_{i+1}}, \ldots$ and $a_j, \overline{a_j}$ corresponding to the column address signals are transmitted to the R&C-DCR. Then, the R&C-DCR conducts an operation similar to the above. The selected signals are transmitted to the column switch C-SW shown in FIG. 2 when the signal $\phi_Y$ delayed from the signal $\phi_{AC}$ is applied to the R&C-DCR. The column address in the M-ARY is thus set in such a manner that, since one of the $2^{j-i}$ output signals of the AD-DCR becomes the high level, one C-SW is selected, so a column address line or data line connected to this C-SW is selected. In this way, one address within the M-ARY is set.

The read-out and write-down operations for the address set as described above will now be explained.

In the read-out mode, the $\overline{WE}$ signal becomes the high level. This $\overline{WE}$ signal is designed so as to become the high level before the $\overline{CAS}$ signal becomes the low level. The reason for this is that, since the low level of the $\overline{CAS}$ signal results in setting one address of the M-ARY, the $\overline{WE}$ signal is brought into the high level beforehand, thereby to prepare for the read-out operation and to shorten a read-out starting time.

When the signal $\phi_{OP}$ of the CAS-group signal is applied to the output amplifier OA, this output amplifier becomes active, and the information of the set address is amplified and then read out at the data output terminal $D_{out}$ through the data output buffer DOB. The read-out is carried out in this manner, and the read-out operation is completed when the $\overline{CAS}$ signal becomes the high level.

In the next place, in the write-down mode, the $\overline{WE}$ signal becomes the low level. When the signal $\phi_{RW}$ which is formed by the $\overline{WE}$ signal of the low level and the $\overline{CAS}$ signal of the low level becomes the high level and is applied to the data input buffer DIB shown in FIG. 2, the DIB becomes active and the write-down data from the input data terminal $D_{in}$ is transmitted to the set address of the M-ARY, whereby the write-down operation is carried out. In the meantime, the inverted signal of the signal $\phi_{RW}$, that is, the signal $\overline{\phi_{RW}}$ of the low level is applied to the DOB, to control the M-ARY so as to prevent the read-out of any data during the write-down operation.

Arrangement and Operation of a D-RAM Transistor Circuit

A practicable circuit arrangement of the D-RAM according to this invention will now be set forth.

Figure 4A:
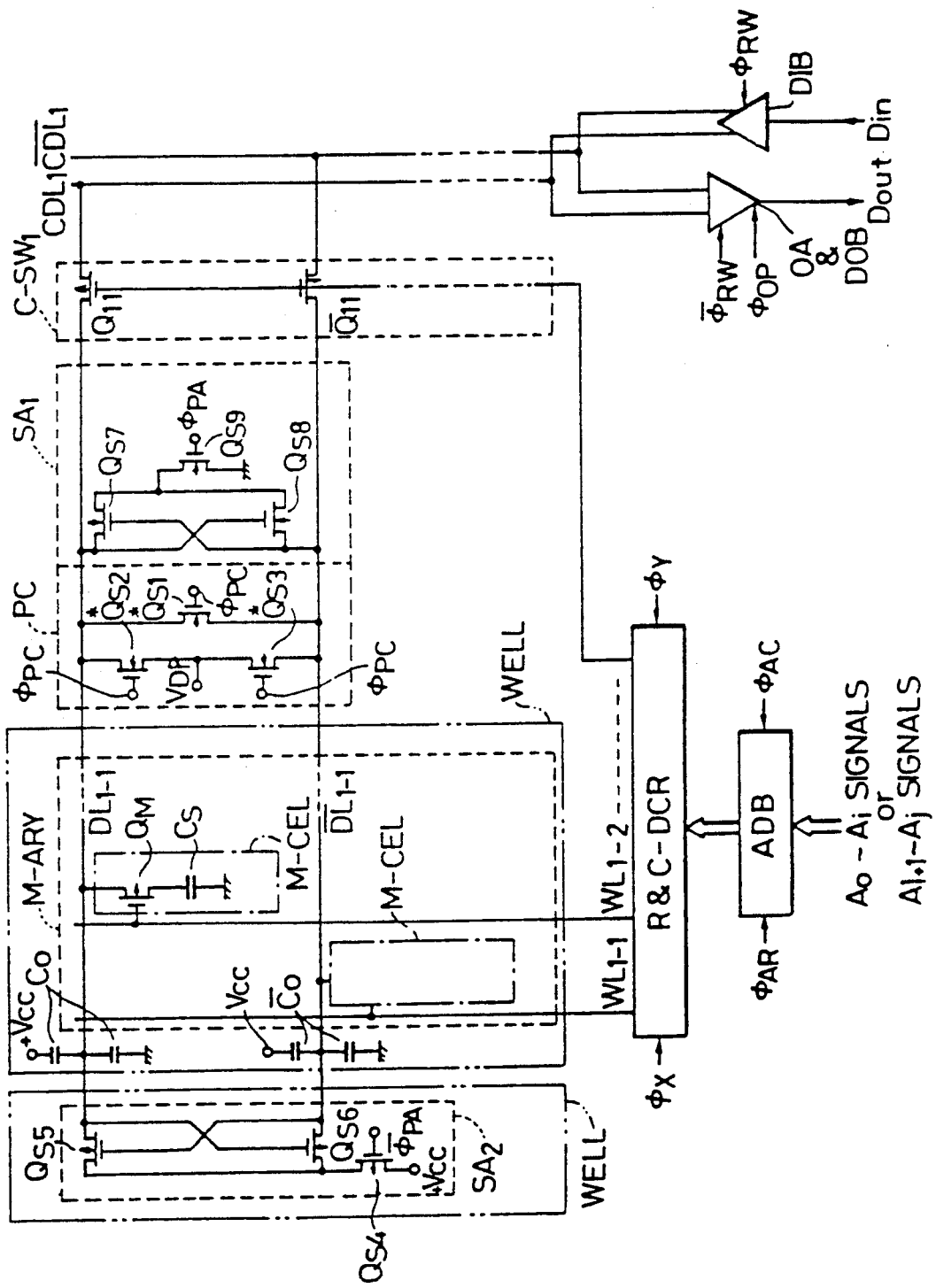
FIG. 4A is a block and schematic diagram of a D-RAM embodying this invention.

FIG. 4A shows a first embodiment of the circuit arrangement of the D-RAM of the present invention. Hereunder, the present invention will be described on the basis of this embodiment.

1. Construction of Memory Cell M-CEL

The M-CEL of 1 bit consists of a capacitor $C_S$ for storing information and a P-MOS $Q_M$ for selecting an address. The information of logic "1" or "0" is stored in the form of the existence or nonexistence of charges in the capacitor $C_S$. The information of the logic "1" is accumulated by a voltage $V_{cc}$, and that of the logic "0" by the null potential.

The gate of the P-MOS $Q_M$ is connected to the word line WL, and one of the source and drain thereof is connected to the data line DL and the other to the capacitor $C_S$.

2. Switching Operation of Memory Cell M-CEL

When the gate voltage of the P-MOS $Q_M$, i.e., the word voltage, has become lower than the power source voltage $+V_{cc}$ by a threshold voltage $V_{thp}$ (the threshold voltage of the P-MOS $Q_M$), the P-MOS $Q_M$ turns "on" to permit the selection of the memory cell M-CEL. On the other hand, in a case of using an N-MOS for a prior-art memory cell (not shown) rather than a P-MOS, when the word voltage has been changed from 0 (zero) V to $(V_{cc} - V_{thn})$ ($V_{thn}$; the threshold voltage of the N-MOS $Q_M$), the N-MOS $Q_M$ turns "on" to permit the selection of the memory cell.

The switching speed of the P-MOS $Q_M$ shown in FIG. 4A can be made higher than that of the N-MOS in such a prior-art memory cell because the information of the logics "1" and "0" can be determined with only the magnitude between $V_{cc}$ and $|V_{thp}|$. The detailed description of the switching operation of the P-MOS $Q_M$ is contained in Japanese Patent Application Laid-open Specification No. 56-44189 (Application No. 54-119403).

3. Construction of the Sense Amplifier

Sense amplifiers $SA_1$ and $SA_2$ ar sense amplifiers by which the difference of potential changes developing on folded data lines $DL_{1-1}$ and $\overline{DL_{1-1}}$ during addressing is expanded in a sense period determined by the timing signals $\phi_{PA}$ and $\overline{\phi_{PA}}$ (sense amplifier control signals), and the input and output nodes of which are coupled to the pair of folded data lines $DL_{1-1}$ and $\overline{DL_{1-1}}$ arranged in parallel.

The sense amplifiers $SA_1$ and $SA_2$ are connected in parallel, and it can be considered that both effectively constitute a single sense amplifier. They differ, however, in that the $SA_1$ is constructed of N-MOS $Q_{S7}$ and $Q_{S8}$, whereas the $SA_2$ is constructed of P-MOS $Q_{S5}$ and $Q_{S6}$ of the opposite conductivity type. Each sense amplifier is composed of a pair of cross-connected FETs ($Q_{S5}$ - $Q_{S8}$) for bringing about a positive-feedback differential amplification operation, and a FET ($Q_{S4}$ - $Q_{S9}$) connected on the source side of the cross-connected FETs for controlling the positive-feedback differential amplification operation.

As noted above, sense amplifiers $SA_1$ and $SA_2$ can be effectively considered as a single complementary sense amplifier, and hence, they may well be arranged in adjacency to each other. However, they can also be disposed to be separate from each other as in FIG. 4A (for example, at both the ends of the M-ARY) for the purpose of efficiently packaging them in consideration of the disposition and configuration of wirings, the transistors, well regions, etc.

More specifically, the sense amplifier $SA_2$ and the memory array M-ARY which are constructed of the P-MOS, and the sense amplifier $SA_1$ and a precharging circuit PC which are constructed of the N-MOS can be disposed in an isolated manner. Therefore, the circuit disposition within the chip can have the P-MOS portion and the N-MOS portion isolated, and the circuits can be efficiently packaged.

The folded data lines $\overline{DL_{1-1}}$ and $DL_{1-1}$ are formed of a metal such as Al, Au, Mo, Ta and W. Since the metal is very low in resistivity, voltage drops in the data lines during the operation are small and no malfunction occurs.

4. Construction of the Precharging Circuit

The precharging circuit PC is composed of a pair of N-MOS $Q_{S2}$ and $Q_{S3}$ for precharging the data lines to about half ($V_{DP}$) of the power source voltage $V_{CC}$, and an N-MOS $Q_{S1}$ for eliminating the unbalance of precharged voltage between both the data lines. As indicated by marks * in the figure, these N-MOS are designed so as to have threshold voltages lower than those of the other N-MOS.

The numbers of the memory cells to be coupled to the respective folded data lines $DL_{1-1}$ and $\overline{DL_{1-1}}$ arranged geometrically in parallel with each other are made equal in order to raise the detection accuracy. Each memory cell is coupled between one word line WL and one of the folded data lines. Each word line WL crosses the adjoining pair of data lines. Therefore, even when a noise component developing on the word line WL is induced on the data lines by electrostatic coupling, the induced noise components appear equally on both the data lines and are cancelled by the differential type sense amplifiers $SA_1$ and $SA_2$.

5. Circuit Operation

Figure 4B:
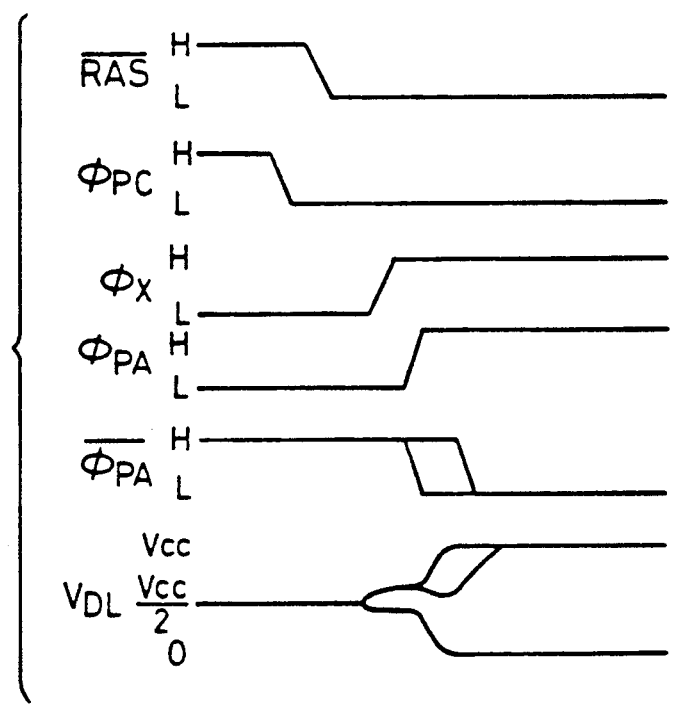
FIG. 4B is a timing diagram of the D-RAM of the embodiment of this invention shown in FIG. 4A.

The operation of the circuit in FIG. 4A will be described with reference to an operating waveform diagram in FIG. 4B.

Before reading out the stored signal of the memory cell, when the precharge control signal $\phi_{PC}$ having a voltage higher than the $V_{CC}$ voltage is at the high level, the N-MOS $Q_{S2}$ and $Q_{S3}$ become conductive, and the stray capacitances $C_0$ and $\overline{C_0}$ of the folded data lines $DL_{1-1}$ and $\overline{DL_{1-1}}$ with respect to the ground are precharged to about $\frac{1}{2} V_{CC}$. At this time, the N-MOS $Q_{S1}$ becomes conductive simultaneously. Therefore, even when the voltages precharged by the N-MOS $Q_{S2}$ and $Q_{S3}$ have become unbalanced, the folded data lines $DL_{1-1}$ and $\overline{DL}_{1-1}$ are short-circuited and are set at the same potential. The N-MOS $Q_{S1}$ to $Q_{S3}$ have the threshold voltages $V_{th}$ set to be lower than those of the transistors without the marks * to avoid any voltage loss between the respective sources and drains.

On the other hand, the capacitor $C_S$ in the memory cell holds a potential substantially equal to zero volt when the written information is of logic "0", and it holds a potential substantially equal to $V_{CC}$ when the information is of logic "1". The precharged voltage $V_{DP}$ of the data lines DL and $\overline{DL}$ is set to be intermediate between both the stored potentials.

Accordingly, when the read line control signal $\phi_X$ becomes the high level to address the desired memory cell, the potential $V_{DL}$ of one data line coupled to the memory cell becomes higher than $V_{DP}$ when the information of "1", or the voltage $V_{CC}$, has been read out, and it becomes lower than $V_{DP}$ when the information of "0", or the zero potential, has been read out. By comparing the potential of the above data line and the potential of the other data line which maintains the potential of $V_{DP}$, it can be determined whether the information of the addressed memory cell is "1" or "0".

The positive-feedback differential amplification operations of the sense amplifiers $SA_1$ and $SA_2$ are started when the FETs $Q_{S9}$ and $Q_{S4}$ have begun to turn "on" owing to the respective timing signals (sense amplifier control signals) $\phi$ and $\overline{\phi_{P4}}$. On the basis of the potential difference given at the addressing, the higher data-line potential $(V_H)$ and the lower potential $(V_L)$ change toward the voltage $V_{CC}$ and the null potential $V_{GND}$, respectively, and the difference becomes wider. The sense amplifier $SA_1$, which is composed of the N-MOS $Q_{S7}$, $Q_{S8}$ and $W_{S9}$, contributes to lower the potential of the data line to the null potential $V_{GND}$, while the sense amplifier $SA_2$ composed of the P-MOS $Q_{S4}$, $Q_{S5}$ and $Q_{S6}$ contributes to raise the potential of the data line to $V_{CC}$. The respective sense amplifiers $SA_1$ and $SA_2$ operate in the grounded-source mode.

When, in this way, the potential of $(V_L - V_{GND})$ has become equal to the threshold voltages $V_{thn}$ of the N-MOS $Q_{S7}$ and $Q_{S8}$ of the sense amplifier $SA_1$, the positive feedback operation of the sense amplifier $SA_1$ ends. In addition, when the potential of $(V_{CC} - V_H)$ has become equal to the threshold voltages $V_{thp}$ of the P-MOS $Q_{S5}$ and $Q_{S6}$ of the sense amplifier $SA_2$, the positive feedback operation of the sense amplifier $SA_2$ ends. Finally, $V_L$ reaches the null potential and $V_H$ reaches $V_{CC}$, and they become stable in a state of low impedance.

If desired, the sense amplifiers $SA_1$ and $SA_2$ may begin operation at the same time. On the other hand, $SA_1$ may well begin its operation prior to $SA_2$, or $SA_2$ may begin its operation prior to $SA_1$. In terms of the read-out speed, the highest speed is obtained by operating $SA_1$ and $SA_2$ at the same time. Since, however, a through-current flows, the power dissipation increases. On the other hand, the expedient of making the operation starting times of $SA_1$ and $SA_2$ different has the advantage that the through-current is avoided and that the power dissipation decreases. Of course, in terms of the read-out speed, this expedient is somewhat inferior to the above.

Figure 4D:
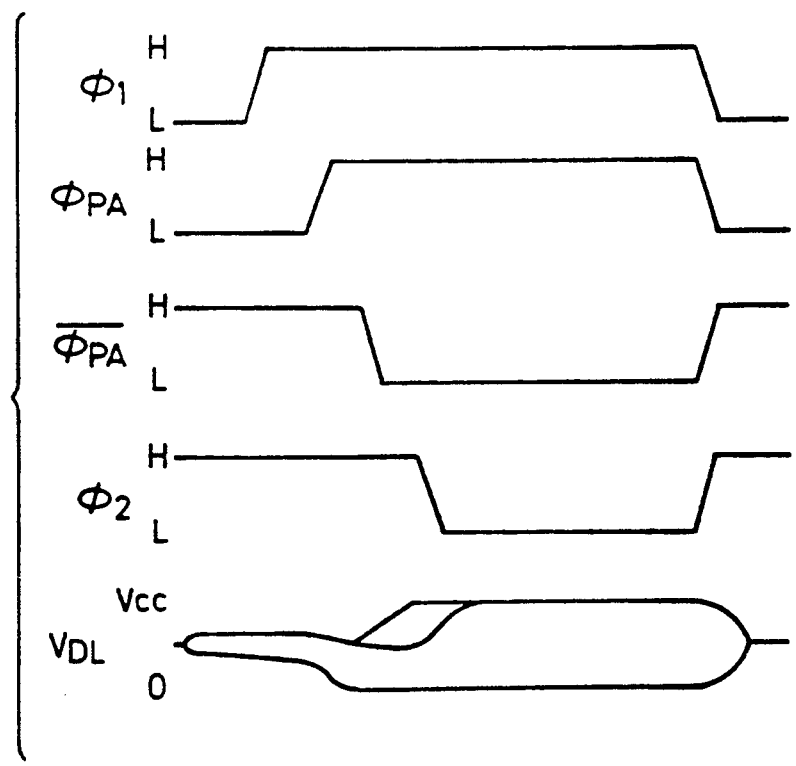
FIG. 4D is a timing diagram of the D-RAM of the embodiment of this invention shown in FIG. 4C.
Figure 4C:
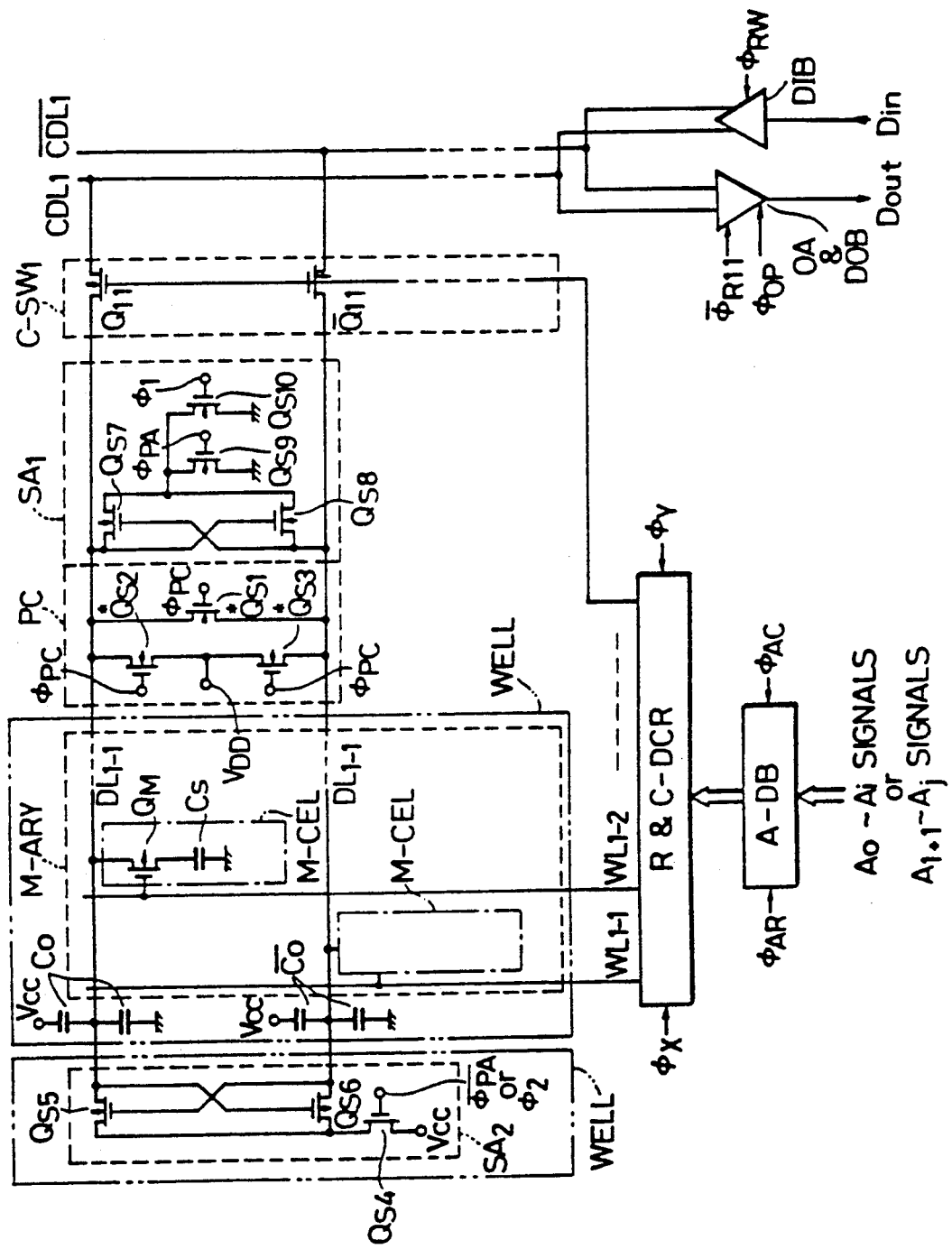
FIG. 4C is a block and schematic diagram of a D-RAM according to another embodiment of this invention.

FIG. 4C shows the circuit arrangement of another embodiment of the D-RAM of this invention. Parts corresponding to those in FIG. 4A are assigned the same symbols. FIG. 4A differs from the embodiment of FIG. 4A in that the positive feedback operation-control means of the sense amplifier $SA_1$ is constructed of N-MOS $Q_{S9}$ and $Q_{S10}$ which are connected in parallel.

The operations of the sense amplifiers $SA_1$ and $SA_2$ in FIG. 4C will be described with reference to FIG. 4D. It is presumed for this description that the folded data lines are charged to about ½ $V_{CC}$ in advance.

The FET $Q_{S10}$ of the positive feedback operation-control means of the sense amplifier $SA_1$ is rendered conductive by a sense amplifier control signal $\phi_1$, whereby one of the FETs $Q_{S7}$ or $Q_{S8}$ is rendered conductive to reduce the lower data-line potential $(V_L)$ by a small amount in the direction of the null potential $V_{GND}$. At this time, the higher data-line potential $(V_H)$ does not change because either the FET $Q_{S7}$ or the FET $Q_{S8}$ is nonconductive. The conductance of the FET $A_{S10}$ is designed to be smaller than that of the FET $Q_{S9}$.

Subsequently, when the FET $Q_{S9}$ has begun to turn "on" owing to the sense amplifier control signal $\phi_{P4}$, the sense amplifier $SA_1$ starts the positive feedback operation and changes the potential $V_L$ toward the null potential $V_{GND}$. That is, after the difference potentials of the folded data lines has been somewhat expanded by the sense amplifier control signal $\phi_1$, the sense amplifier control signal $\phi_{P4}$ is applied so as to execute the positive feedback operation of the sense amplifier $SA_1$. Thus, even when the potential difference of the folded data lines is small, it is permitted to be amplified by the sense amplifier $SA_1$. In other words, the sensitivity of the sense amplifier improves.

Subsequently, when the FET $Q_{S4}$ has begun to be turned "on" by a sense amplifier control signal $\phi$ or $\phi_2$, the positive-feedback differential amplification operation of the sense amplifier $SA_2$ is started, and the higher data-line potential $(V_H)$ rises toward $V_{CC}$. Eventually, the potential $V_L$ of the data line reaches the null potential and $V_H$ reaches $V_{CC}$, and they become stable in a state of low impedance.

Figure 4E:
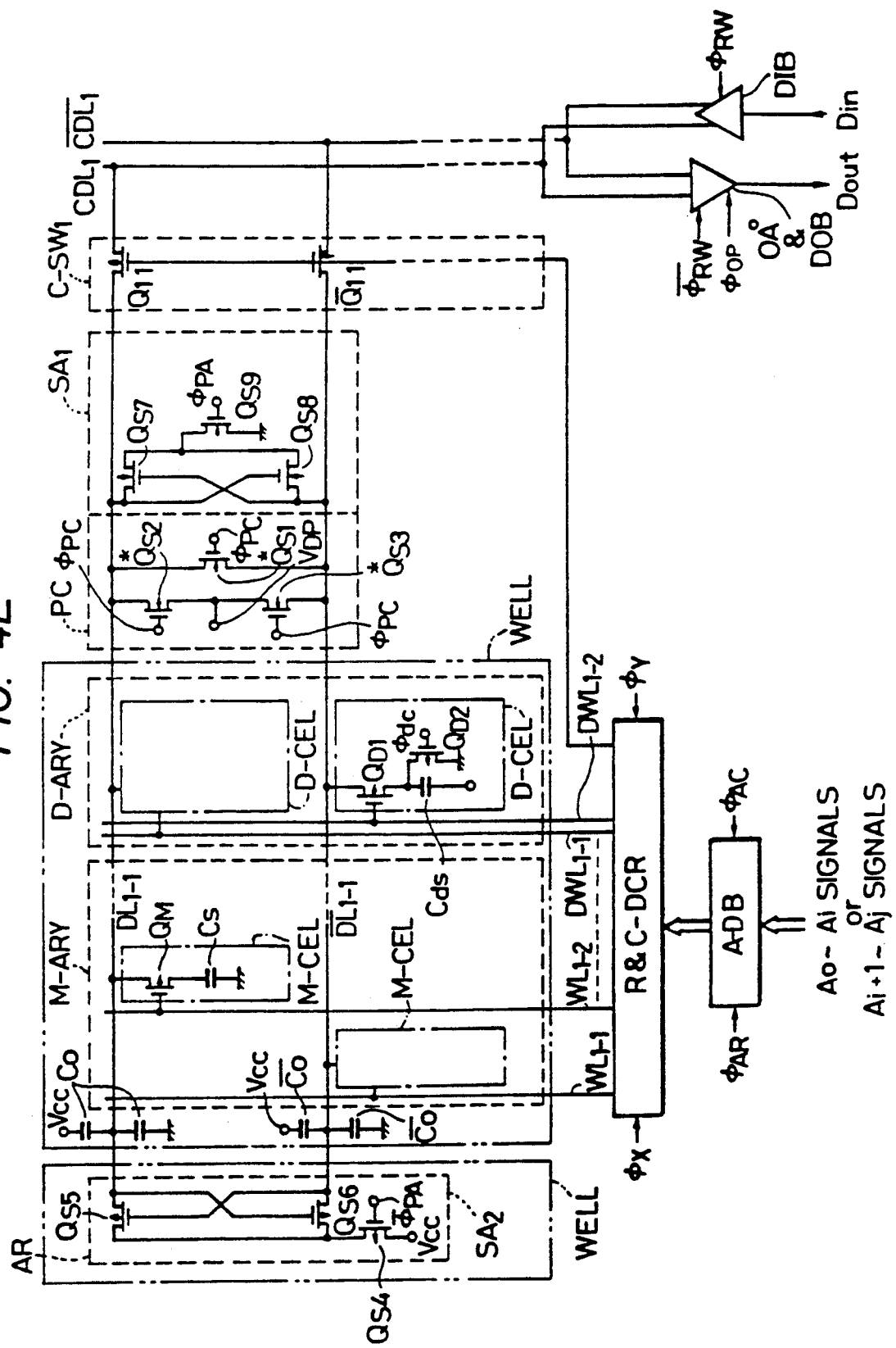
FIG. 4E is a block and schematic diagram of a D-RAM according to another embodiment of this invention.

FIG. 4E shows the circuit arrangement of the D-RAM according to another embodiment of this invention. Parts corresponding to those in FIG. 4A are assigned the same symbols. This FIG. 4E differs from the embodiment of FIG. 4A in that dummy cells D-CEL are connected to the folded data lines.

The dummy cell D-CEL is constructed of a series connection circuit consisting of a P-MOS $Q_{D1}$ and a P-MOS $Q_{D2}$. The gate of the P-MOS $Q_{D1}$ is connected to a dummy word line. Either the source or drain of the P-MOS $Q_{D1}$ is connected to the data line while the other of the source and drain is connected to one of the source and drain of the P-MOS $Q_{D2}$. The other of the source and drain of P-MOS $Q_{D2}$ is grounded.

The dummy cell D-CEL does not require a capacitance $C_{ds}$ for storing the reference potential. The reason is that the reference potential is precharged in the data lines. The dummy cells D-CEL are fabricated under the same manufacturing conditions and with the same design constants as those of the memory cells M-CEL.

The dummy cells D-CEL function to cancel various noise which develop on the folded data lines during, for example, the write-down and read-out operations of memory information.

Time-Sequential Operations of a D-RAM Transistor Circuit

The time-sequential operations of the D-RAM transistor circuit will be described with reference to FIG. 4A.

1. Read-Out Signal Quantity

The read-out of information is carried out in such a way that the P-MOS $Q_M$ is turned "on" to couple the capacitor $C_S$ to the common column data line DL. After this, the manner in which the potential of the data line DL changes in accordance with the quantity of charges stored in the capacitor $C_S$ is sensed. It is presumed that the potential charged in the stray capacitance $C_O$ of the data line DL beforehand is half of the power source voltage, i.e., $\frac{1}{2} V_{CC}$. Then, when the information accumulated in the capacitor $C_S$ is "1" (i.e., the potential $V_{CC}$), the potential $(V_{DL})$"1" of the data line DL becomes $V_{CC} \cdot (C_0+2C_S)/2(C_0+C_S)$ when the corresponding memory cell is address. On the other hand, when the information is "0" (zero V), the potential $(V_{DL})$"0" of the data line DL becomes $V_{CC} \cdot C_0/2(C_0+C_S)$. Here, the difference between the logic "1" and the logic "0", that is, a signal quantity to be detected, $\Delta V_S$ becomes:

$$\Delta V_S = (V_{DL})\text{"1"} - (V_{DL})\text{"0"}$$
$$= V_{CC} \cdot C_S/(C_0 + C_S)$$
$$= (C_S/C_0) \cdot V_{CC}/\{1 + (C_S/C_0)\}$$

Due to the fact that the memory matrix of high integration density has no capacitance even when the memory cells are made small, and the fact that a large number of such memory cells are connected to the common data lines, $C_S << C_O$ holds, that is, $(C_S/C_O)$ has a value almost negligible relative to 1 (one). Accordingly, the above equation is expressed by $\Delta V_S \simeq V_{CC} \cdot (C_S/C_O)$, and $\Delta V_S$ is a very small signal.

2. Read-Out Operation

Precharging Period

The precharging during the read-out operation is the same as the precharging operation discussed previously.

Row Addressing Period

The row address signals $A_0$ to $A_j$ which have been supplied from the address buffer ADB under the control of the timing signal (address buffer control signal) $\phi_{AR}$ (refer to FIGS. 3A and 3B) are decoded by the row and column decoder R&C-DCR, and the addressing of the memory cell M-CEL is started simultaneously with the rise of the word line control signal $\phi_X$.

As a result, the voltage difference substantially equal to $\Delta V_S$ arises between the folded data lines $\overline{DL_{1-1}}$ and $DL_{1-1}$ on the basis of the stored content of the memory cell as stated before.

Sensing

At the same time that the N-MOS $Q_S9$ has begun to be rendered conductive by the timing signal (sense amplifier control signal) $\phi_{PA}$, the sense amplifier $SA_1$ starts the positive feedback operation and amplifies the detection signal of $\Delta V_S$ which developed during the addressing. Simultaneously with the amplifying operation, or after the start of the amplifying operation, the sense amplifier $SA_2$ starts the positive feedback operation due to the timing signal $\overline{\phi_{PA}}$ and recovers the level of logic "1" to $V_{CC}$.

Data Output Operation

The column address signals $A_{i+1}$ to $A_j$ which have been sent from the address buffer ADB in synchronism with the timing signal (address buffer control signal) $\phi_{AC}$ are decoded by the row and column decoder R&C-DCR. Subsequently, the stored information of the memory cell M-CEL at the column address which has been selected by the timing signal (column switch control signal) $\phi_Y$ is transmitted to the common input/output lines $CDL_1$ and $\overline{CDL_1}$ through the column switch C-$SW_1$.

Subsequently the output amplifier/data output buffer OA & DOB is operated by the timing signal (data output buffer and output amplifier-control signal) $\phi_{OP}$, and the stored information which has been read is transmitted to the output terminal $D_{out}$ of the chip. During write-down, the OA & DOB is held inoperative by the timing signal (data output buffer-control signal) $\overline{\phi_{RW}}$.

3. Write-Down Operation

Row Addressing Period

The precharging, addressing and sensing operations are quite the same as in the foregoing read-out operation. Accordingly, irrespective of the logic value of input write-down information $D_{in}$, the stored information of the memory cell into which the information ought to be written is read out between the folded data lines $DL_{1-1}$ and $\overline{DL_{1-1}}$. This information read out is ignored by a writing operation to be stated below. Therefore, the operations up to this point of time may substantially be considered as a row address selection operation.

Writing Period

As in the read-out operation, the folded data lines $DL_{1-1}$ and $\overline{DL_{1-1}}$ which lie at the column selected in synchronism with the timing signal (column switch-control signal) $\phi_Y$ are coupled to the common input-/output lines $CDL_1$ and $\overline{CDL_1}$ through the column switch C-$SW_1$.

Subsequently, complementary writing input signals $d_{in}$ and $\overline{d_{in}}$ supplied from the data input buffer DIB in synchronism with the timing signal (data input buffer-control signal) $\phi_{RW}$ are written into the memory cell M-CEL through the column switch C-$SW_1$. In the meantime, the sense amplifier SA is operating. Since, however, the output impedance of the data input buffer DIB is low, the information which is to appear on the folded data lines $DL_{1-1}$ and $\overline{DL_{1-1}}$ is determined by the information at the input $D_{in}$.

4. Refresh Operation

The refresh is carried out in such a way that the information stored in the memory cell M-CEL which is in danger of being lost is read out onto the column common data line DL. This read-out information is brought to a restored level by the sense amplifiers $SA_1$ and $SA_2$, and is then written into the memory cell M-CEL again. Accordingly, the refresh operation is similar to the operation of the row addressing or sensing period which has been explained for the read-out operation. In this case, however, the column switch C-$SW_1$ is made inoperative, and all the columns re simultaneously refreshed row by row.

Circuit Arrangement of a 2-Mat Type 64K-D-RAM

Figure 5A:
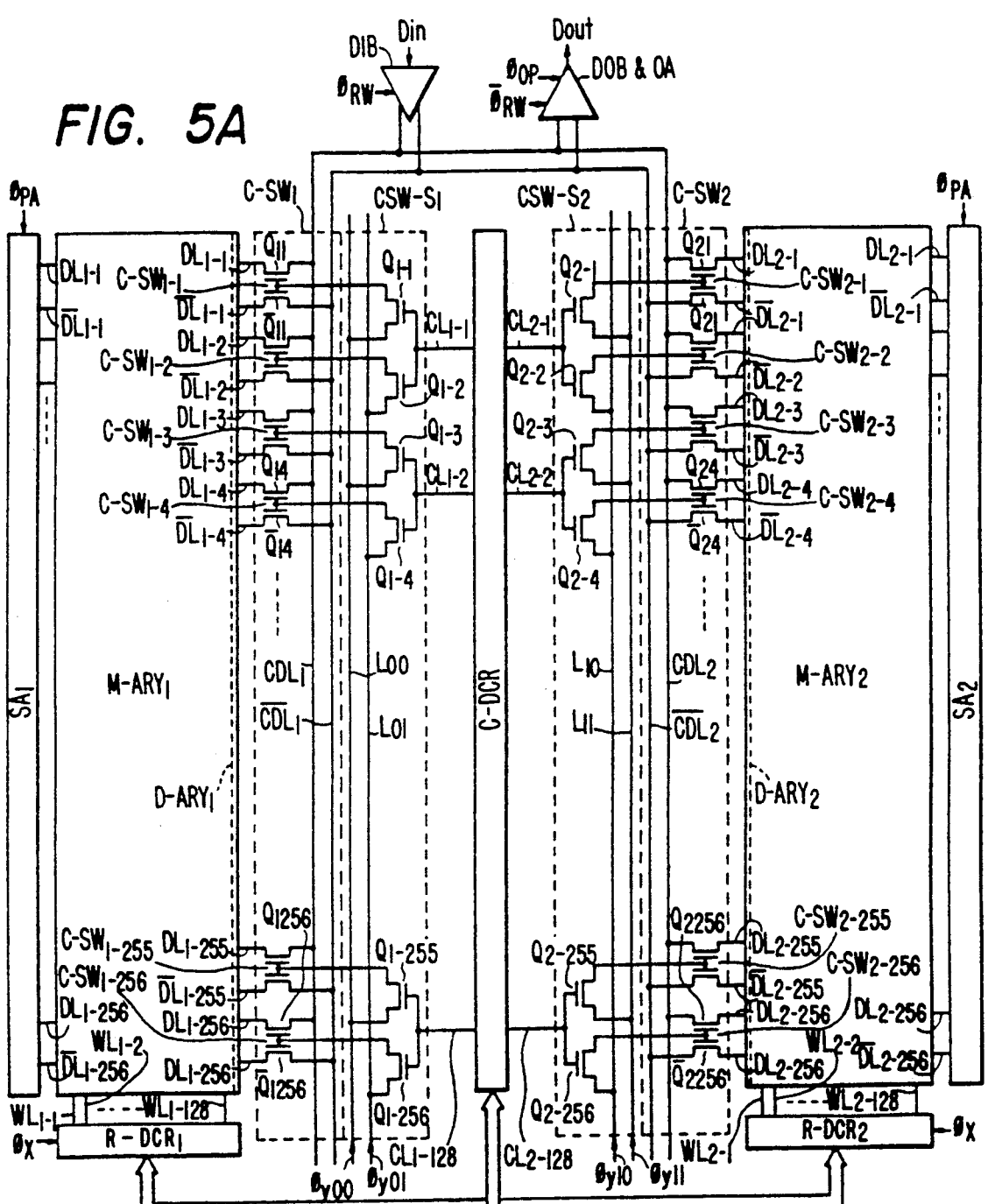
FIG. 5A is a circuit arrangement diagram of a 2-mat type 64 Kbit D-RAM according to this invention.

FIG. 5A shows a diagram of a D-RAM circuit arrangement which is constructed in accordance with this invention and in which memory cells of about 64 Kbits are divided and arrayed into two memory cell matrices (memory arrays M-$ARY_1$ and M-$ARY_2$) each having a memory capacity of 128 rows×256 columns=32,768 bits (32 Kbits). Principal blocks in this figure are depicted in conformity with the actual geometrical disposition. The respective blocks have the same constructions as described above, and are assigned the same symbols. With regard to the circuit arrangement of the memory array, any of the systems shown in FIGS. 4A, 4C and 4E can be adopted.

The row-series address selection lines (word lines WL) of the respective memory arrays M-ARY$_1$ and M-ARY$_2$ are supplied from row decoders (serving also as word drivers) R-DCR$_1$ and R-DCR$_2$ with $2^7 = 128$ possible decode output signals which are obtained on the basis of row address signals A$_0$ - A$_6$.

A column decoder C-DCR provides 128 possible decode output signals on the basis of column address signals A$_9$-A$_{15}$. The column selecting decode output signals are common to the right and left memory arrays and upper and lower adjoining columns within each memory array, totaling four columns.

In order to select any one of the four columns, address signals A$_7$ and A$_8$ are allotted. By way of example, the signal A$_7$ is allotted to the selection of the right or left array, and the signal A$_8$ is allotted to the selection of the upper or lower column.

It is a $\phi_{yij}$ signal generator circuit $\phi_{yij}$-SG that encodes the address signals A$_7$ and A$_8$ into four combinations, and it is column switch selectors CSW-S$_1$ and CSW-S$_2$ that switch the columns on the basis of the output signals $\phi_{y00}$, $\phi_{y01}$, $\phi_{y10}$ and $\phi_{y11}$ of the generator circuit.

In this manner, the decoder for selecting the columns of the memory arrays is divided into the two stages of the column decoder C-DCR and the column switch selector CSW-S$_1$ as well as CSW-S$_2$. The first aim of the division of the decoder into these two stages is to prevent any useless blank part from occurring within the IC chip. That is, it is intended that the vertical arrayal pitch of NOR gates which take charge of a pair of right and left output signal lines of the column decoder C-DCR and which have comparatively large areas is made equal to the column arrayal pitch of the memory cells. Owing to the division of the decoder into the two stages, the NOR gate has the number of its constituent transistors reduced and can have its occupying area made small.

The second aim of the division of the decoder into the two stages is that the number of the NOR gates connected to one address signal line is reduced. This lightens the load placed on the address signal line and enhances the switching speed.

The address buffer ADB processes the eight multiplexed external address signals A$_0$-A$_7$; and A$_8$-A$_{15}$ into eight complementary pairs of address signals (a$_0$, $\overline{a_0}$) - (a$_7$, $\overline{a_7}$); and (a$_8$, $\overline{a_8}$) - (a$_{15}$, $\overline{a_{15}}$), respectively. It then transmits them to the decoder circuits at the timings $\phi_{AR}$ and $\phi_{AC}$ adjusted to the operations within the IC chip.

Circuit Operation of a 2-Mat Type 64-K-D-RAM

Figure 5B:
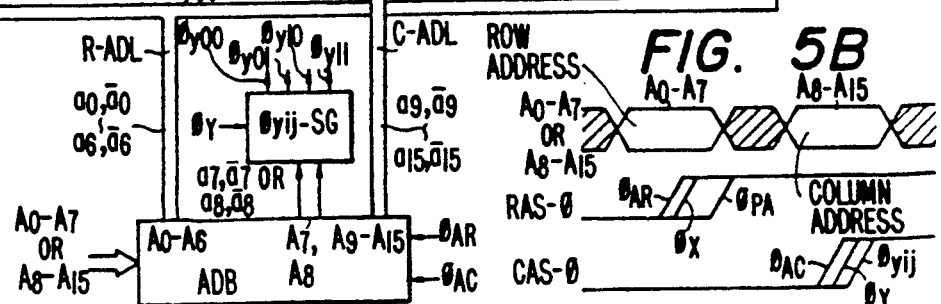
FIG. 5B is a timing diagram of the 2-mat type 64 Kbit D-RAM shown in FIG. 5A.

The circuit operation of an address setting process in the 2-mat type 64-K-D-RAM will be described with reference to FIGS. 5A and 5B.

First, the address buffer control signal $\phi_{AR}$ of the row series rises to the high level, whereby the seven complementary pairs of row address signals (a$_0$, $\overline{a_0}$) - (a$_6$, $\overline{a_6}$) corresponding to the row address signals A$_0$-A$_6$ are applied from the address buffer ADB to the row decoders R-DCR$_1$ and R-DCR$_2$ through a row address line R-ADL. Following this, the word line control signal $\phi_X$ rises to the high level to activate the row decoders R-DCR$_1$ and R-DCR$_2$. These row decoders then select one of the word lines WL of each of the memory arrays M-ARY$_1$ and M-ARY$_2$ and set it at the high level.

Subsequently, the address buffer control signal $\phi_{AC}$ of the column series rises to the high level, whereby the seven complementary pairs of column address signals (a$_9$, $\overline{a_9}$) - (a$_{15}$, $\overline{a_{15}}$) corresponding to the column address signals A$_9$-A$_{15}$ are applied from the address buffer ADB to the column decoder C-DCR through a column address line C-ADL. As a result, one pair of output signal lines among the 128 pairs of output signal lines of the column decoder C-DCR becomes the high level, and the high level signals are applied to the column switch selectors CSW-S$_1$ and CSW-S$_2$.

Subsequently, when the column switch control signal $\phi_Y$ rises to the high level, the $\phi_{yij}$ signal generator circuit $\phi_{yij}$-SG becomes operable. On the other hand, the complementary pair of signals (a$_7$, $\overline{a_7}$) corresponding to the address signal A$_7$ and the complementary pair of signals (a$_8$, $\overline{a_8}$) corresponding to the address signal A$_8$ have already been applied to the $\phi_{yij}$ signal generator circuit $\phi_{yij}$-SG respectively when the address buffer control signal $\phi_{AR}$ has become the high level and when the address buffer control signal $\phi_{AC}$ has become the high level. Accordingly, when the column switch control signal $\phi_Y$ has become the high level, the $\phi_{yij}$ signal generator circuit $\phi_{yij}$-SG transmits the signals to the column switch selectors CSW-S$_1$ and CSW-S$_2$ substantially concurrently therewith.

In this way, one pair among a total of 512 transistor pairs in the column switches C-SW$_1$ and C-SW$_2$ is selected, and one pair of data lines DL within the memory array are connected to the common data line CDL.

D-RAM IC Layout Pattern of the 2-Mat Type

Figure 6:
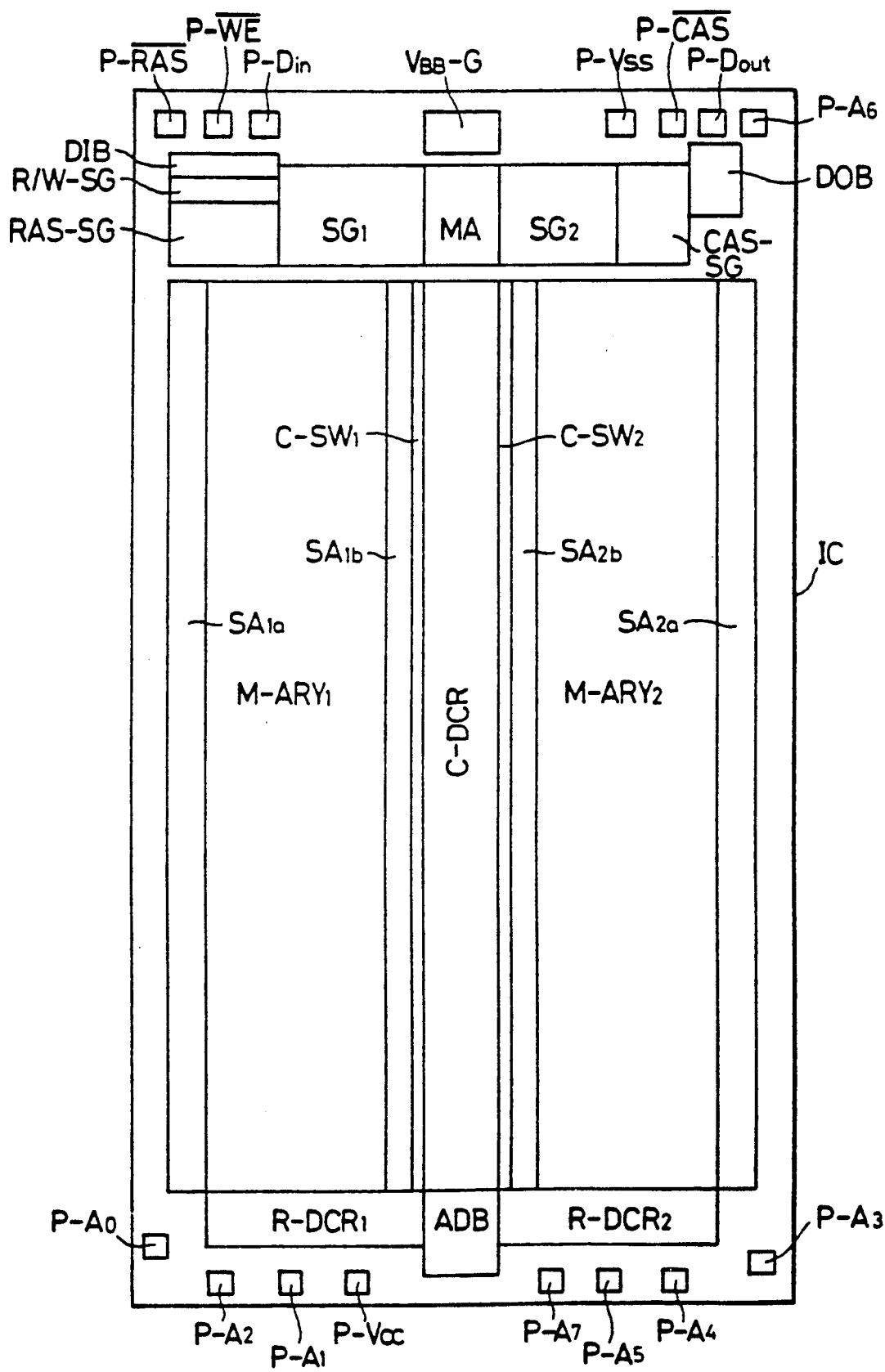
FIG. 6 is a layout pattern diagram of a 2-mat type D-RAM IC according to this invention.

The D-RAM IC layout pattern of the so-called 2-mat type in which a single IC chip includes two divided memory arrays will be described with reference to FIG. 6.

The two memory arrays M-ARY$_1$ and M-ARY$_2$, each of which is constructed of a plurality of memory cells, are arranged in the IC chip in a manner to be spaced from each other. In the central part of the IC chip between the M-ARY$_1$ and the M-ARY$_2$, the common column decoder C-DCR is arranged. The column switch C-SW$_1$ for the M-ARY$_1$ is arranged between the M-ARY$_1$ and the C-DCR. On the other hand, the column switch C-SW$_2$ for the M-ARY$_2$ is arranged between the M-ARY$_2$ and the C-DCR.

The sense amplifiers SA$_1$ and SA$_2$ are respectively arranged in the left end part and right end part of the IC chip in order to prevent them from operating erroneously due to noise, for example, signals applied to the C-DCR, and also to facilitate the layout of wirings.

On the left side of the upper part of the IC chip, the data input buffer DIB, a read/write signal generator circuit R/W-SG, a RAS signal generator circuit RAS-SG, and a RAS-group signal generator circuit SG$_1$ are arranged. In proximity to these circuits, a $\overline{RAS}$ signal applying pad P-$\overline{RAS}$, a $\overline{WE}$ signal applying pad P-$\overline{WE}$, and a data signal applying pad P-D$_{in}$ are provided.

On the other hand, on the right side of the upper part of the IC chip, the data output buffer DOB, a CAS signal generator circuit CAS-SG, and a CAS-group signal generator circuit SG$_2$ are disposed. In proximity to these circuits are disposed a V$_{SS}$ voltage feeding pad P-$V_{SS}$, a $\overline{CAS}$ signal applying pad P-$\overline{CAS}$, a data signal deriving pad P-$D_{out}$, and an address signal $A_6$ feeding pad P-$A_6$.

A main amplifier MA is arranged between the RAS-group signal generator circuit $SG_1$ and the CAS-group signal generator circuit $SG_2$.

A $V_{BB}$ generator circuit $V_{BB}$-G is arranged above one of the circuits which occupies a relatively large area, such as the RAS-group signal generator circuit $SG_1$, the CAS-group signal generator circuit $SG_2$ or the main amplifier MA. The reason for this is that the $V_{BB}$-G produces minority carriers, and there is the danger that the memory cells constituting the M-$ARY_1$ and M-$ARY_2$ will suffer from undesired information inversion due to the minority carriers. Therefore, in order to prevent this, the $V_{BB}$ generator circuit $V_{BB}$-G is disposed at a position which is as far away as possible from the M-$ARY_1$ and M-$ARY_2$ as described above.

On the left side of the lower part of the IC chip, the row decoder R-$DCR_1$ for the M-$ARY_1$ is arranged. In proximity to the R-$DCR_1$ are disposed address signal feeding pads P-$A_0$, P-$A_1$ and P-$A_2$ and a $V_{CC}$ voltage feeding pad P-$V_{CC}$.

On the other hand, on the right side of the lower part of the IC chip, the row decoder R-$DCR_2$ for the M-$ARY_2$ is arranged. In proximity to the row decoder R-$DCR_2$, there are disposed address signal applying pads P-$A_3$, P-$A_4$, P-$A_5$ and P-$A_7$.

The address buffer ADB is arranged between the R-$DCR_1$ and R-$DCR_2$.

Layout Pattern Diagram of the Power Supply Lines

A partial layout pattern diagram centering on the memory arrays M-ARY and the sense amplifiers $SA_1$ and $SA_2$ in the 64 Kbit D-RAM will be described with reference to FIG. 7A. The memory arrays M-ARY and the sense amplifiers $SA_2$ are formed in individual N-channel type well regions enclosed with dot-and-dash lines. Since the memory arrays M-ARY, the sense amplifiers $SA_2$, etc. are laid out in line symmetry with respect to the column decoder C-DCR, the memory arrays M-ARY and the sense amplifiers $SA_1$ and $SA_2$ within well regions on the right side are omitted or illustrated only schematically.

Figure 7A:
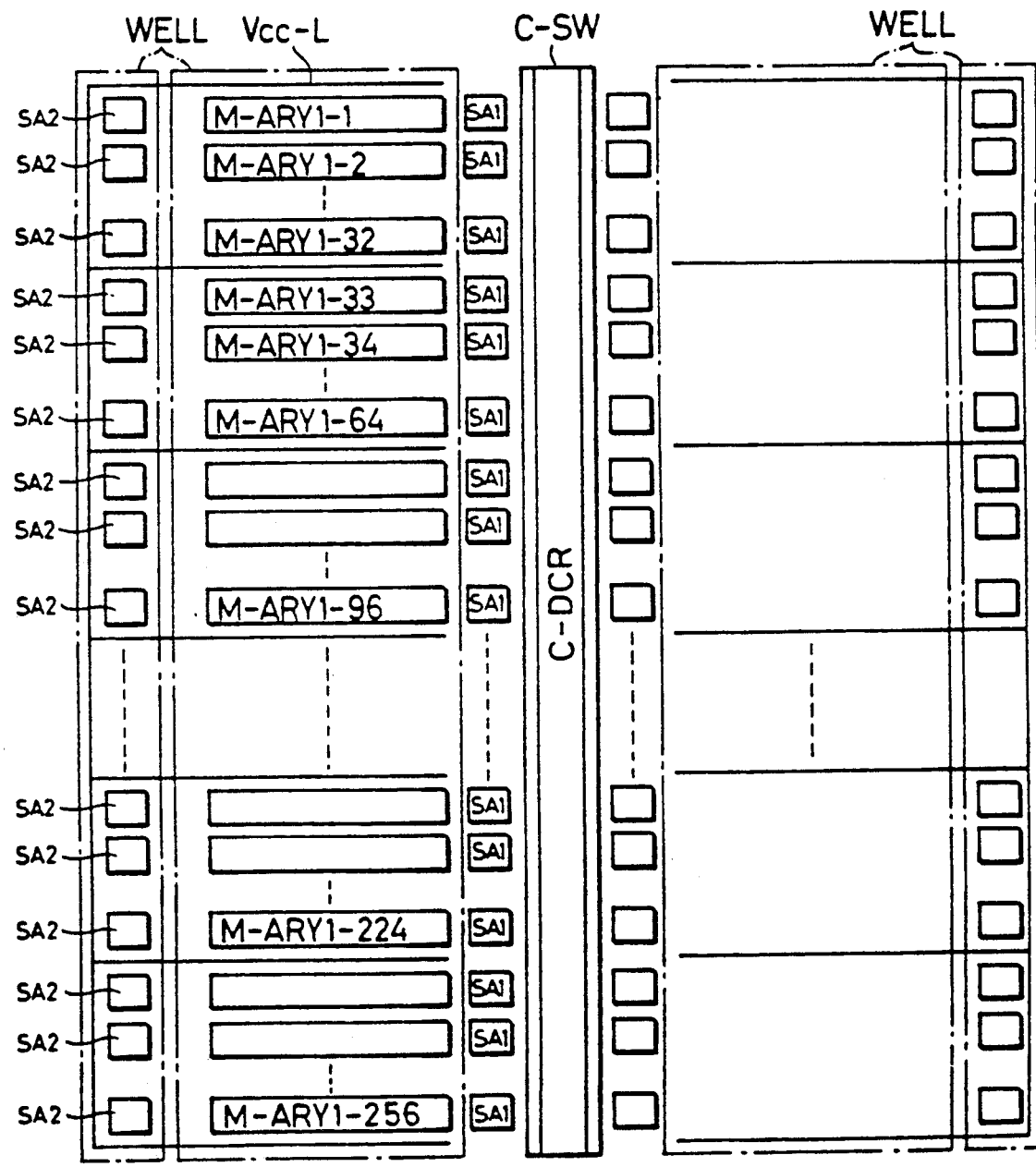
FIGS. 7A and 7B are partial layout pattern diagrams of 2-mat type D-RAM ICs according to this invention.

Since the N-channel type wells are supplied with the power source voltage $V_{CC}$, power supply lines $V_{CC}$-L are formed as shown in FIG. 7A. In FIG. 7A, assuming that the memory array M-$ARY_{1-1}$ is in the first row, the power supply line is formed every 32nd row of the memory arrays M-ARY. As the intervals of the power supply lines become larger, the well voltage becomes less uniform. In order to prevent this drawback, the power supply line may be formed every row of the M-ARY. Unfortunately, if this is done, the chip area increases. It is therefore favorable to form the power supply lines at equal intervals among the memory arrays M-ARY, for example, at intervals of 8 rows, 16 rows, 32 rows or 64 rows.

To the end of making the well voltage uniform, the power supply lines are formed of a metal exhibiting almost no voltage loss, such as Al, Au, Mo and Ta. If the power supply lines formed of the metal are disposed in the wells, they should preferably be arranged in parallel with the data lines so as not to short-circuit to the data lines formed of Al.

The N-channel type well region for the memory arrays M-ARY and that for the sense amplifiers $SA_2$ are isolated in the arrangement shown in FIG. 7A for the following reason.

A voltage drop develops between the power supply line within the well region for the sense amplifier $SA_2$ and the positive feedback operation-control means (FIG. 4A) within the sense amplifier $SA_2$. The voltage drop becomes greater in the sense amplifier $SA_2$ as a function of its increased distance from the power supply line, and this produces noise. If the memory arrays M-ARY and the sense amplifiers $SA_2$ are formed within a single N-type well region, the aforecited voltage drop will lower the well potential. This, in turn, results in lowering the threshold voltage $V_{TH}$ of the P-MOS $Q_M$ (FIG. 4A) of the memory cell. Then, the P-MOS $Q_M$ will become easier to turn "on", which can be the cause of a malfunction in the memory operation. Therefore, in FIG. 7A, the N-channel type well regions for forming the memory arrays M-ARY and the sense amplifiers $SA_2$ ar formed independently of each other so that noise developing in the sense amplifiers $SA_2$ is prevented from influencing memory operations.

Figure 7B:
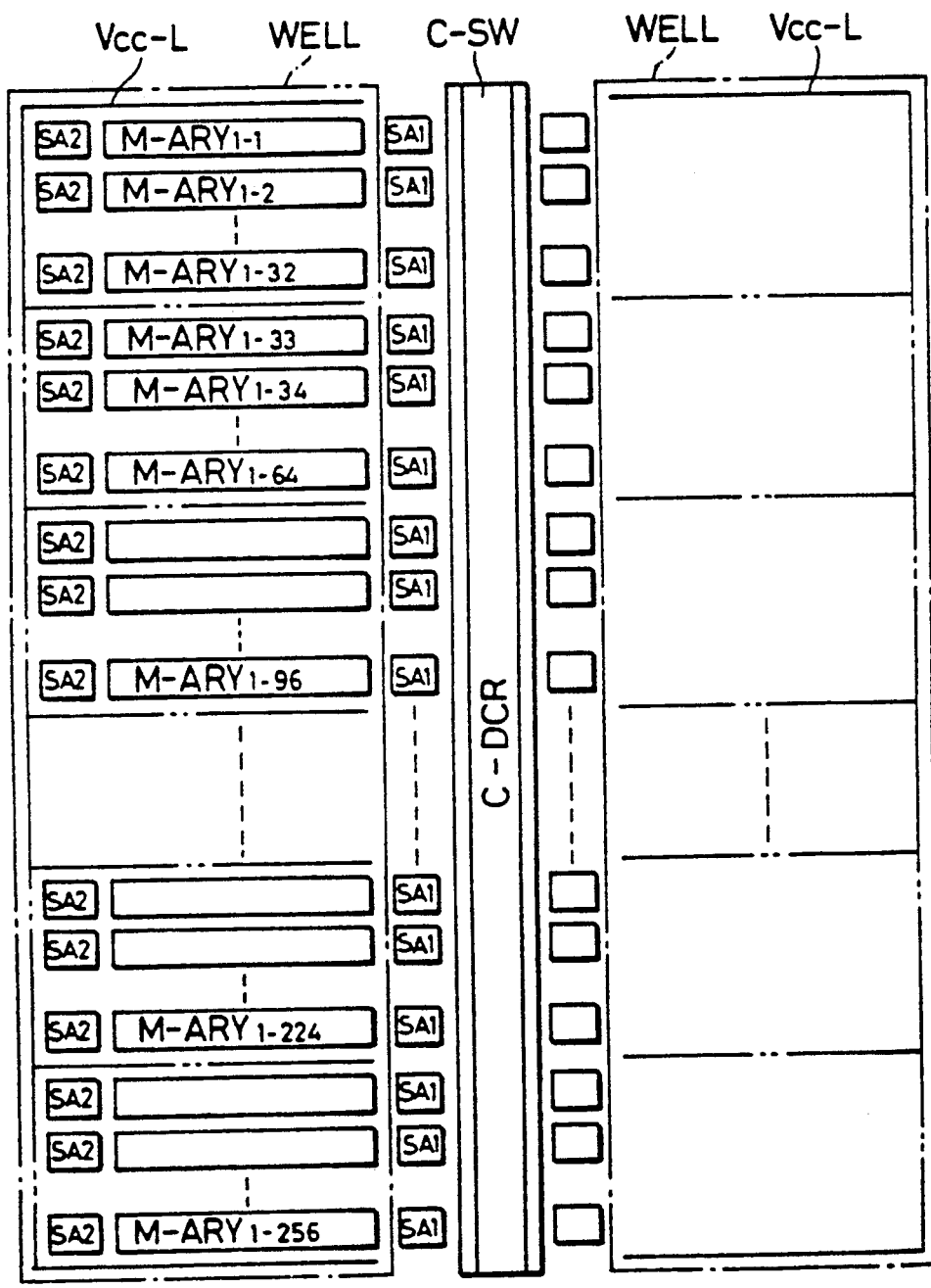

FIG. 7B illustrates a modification of the layout shown in FIG. 7A, and is a partial layout pattern diagram centering on the memory arrays M-ARY and the sense amplifiers $SA_1$ and $SA_2$ in the 64 Kbit D-RAM. Parts corresponding to those in FIG. 7A are assigned the same symbols. FIG. 7B differs from the layout of FIG. 7A in that the memory arrays M-ARY and the sense amplifiers $SA_2$ are formed within an identical well region. This modification has the advantage that the chip area becomes smaller than in the layout of FIG. 7A. It is disadvantageous, however, in that the noise developing in the sense amplifiers $SA_2$ is prone to affect the memory operations as described above.

Element Structure of a Memory Cell

Figure 8A:
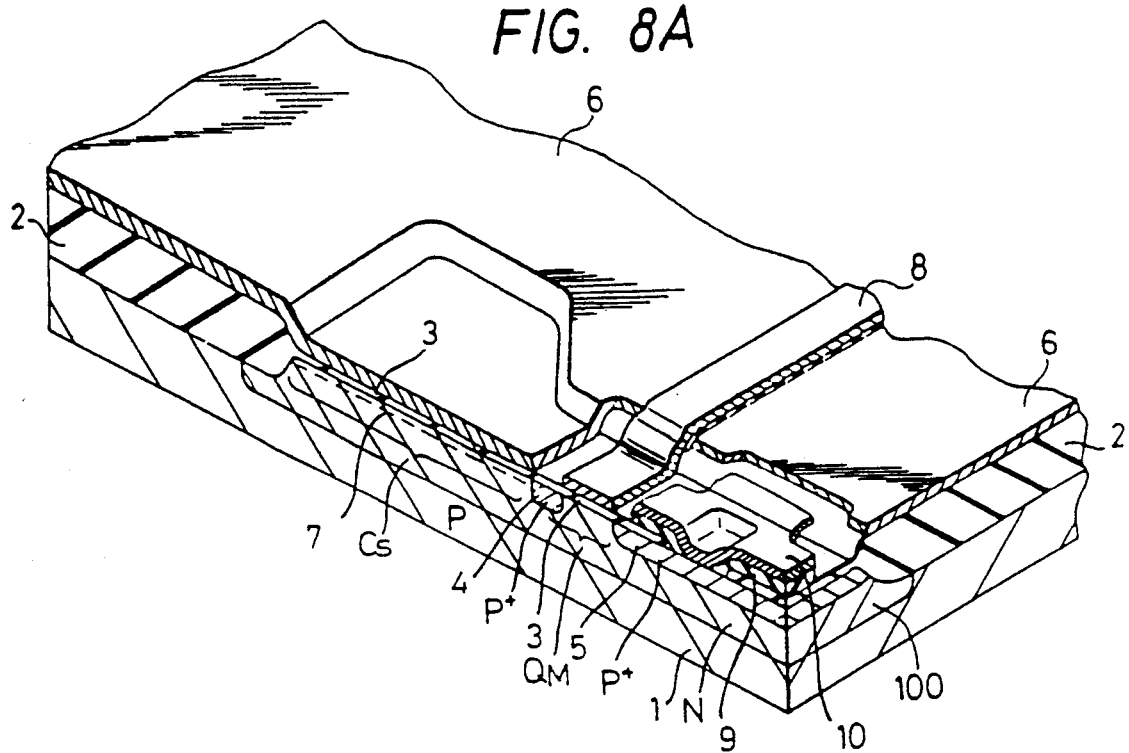
FIG. 8A is an element structure view of a memory cell according to this invention.

FIG. 8A is a perspective sectional view showing the element structure of one memory cell M-CEL described above. Numeral 1 designates a P-type silicon semiconductor substrate, numeral 2 a comparatively thick insulating film such as silicon oxide film (hereinbelow, called "field insulating film"), numeral 3 a comparatively thin insulating film such as silicon oxide film (hereinbelow, called "gate insulating film"), numerals 4 and 5 P+-type semiconductor regions, numeral 6 a first polycrystalline silicon layer, numeral 7 a P-type surface inversion layer, numeral 8 a second polycrystalline silicon layer, numeral 9 a PSG (phosphosilicate glass) layer, numeral 10 an aluminum layer, and numeral 100 an N-type well region.

The MOS $Q_M$ in one memory cell M-CEL has its substrate, well region, drain region, source region, gate insulating film and gate electrode made of the above-mentioned P-type semiconductor substrate 1, N-type well region 100, P+-type semiconductor region 4, P+-type semiconductor region 5, gate insulating film 3 and second polycrystalline silicon layer 8, respectively. The second polycrystalline silicon layer 8 is used as, for example, the word line $WL_{1-2}$ shown in FIG. 4A. The aluminum layer 10 connected to the P+-type semiconductor region 5 is used as, for example, the data line $DL_{1-1}$ shown in FIG. 4A.

On the other hand, the storing capacitor $C_S$ in the memory cell M-CEL has one electrode, a dielectric layer and the other electrode thereof made of the first polycrystalline silicon layer 6, the gate insulating film 3 and the P-type surface inversion layer 7, respectively. The ground voltage $V_{SS}$ is applied to the first polycrystalline silicon layer 6, and it induces the P-type surface inversion layer 7 in the surface of the N-type well region 100 owing to the field effect caused through the gate insulating film 3.

Although the MOS $Q_M$ in the memory cell M-CEL has been exemplified as the P-channel type, an N-channel type MOS $Q_M$ can be formed by changing all the aforecited conductivity types into the opposite conductivity types.

Element Structure of a Dummy Cell

Figure 8B:
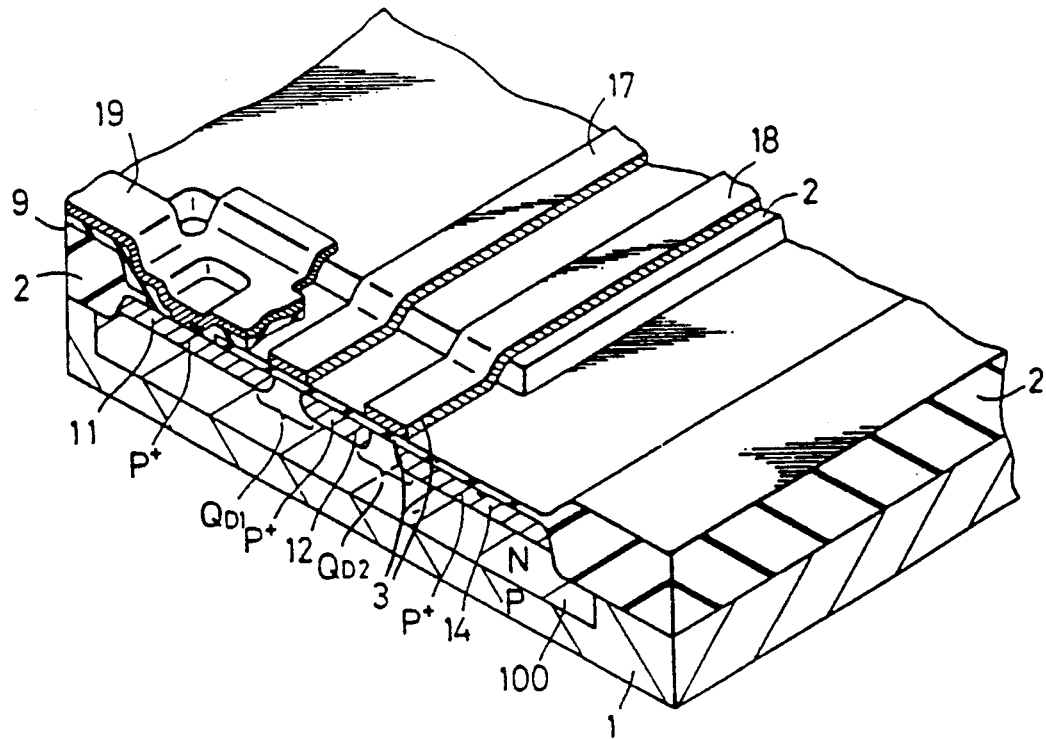
FIG. 8B is an element structure view of a dummy cell according to this invention.

FIG. 8B is a perspective sectional view showing the element structure of one dummy cell D-CEL. In FIG. 8B, especially numerals 11, 12 and 14 designate $P^+$-type semiconductor regions, numerals 17 and 18 second polycrystalline silicon layers, and numeral 19 an aluminum layer.

The MOS $Q_{D1}$ in one dummy cell D-CEL has its substrate, well region, source region, drain region, gate insulating film and gate electrode made of the P-type semiconductor substrate 1, N-type well region 100, $P^+$-type semiconductor region 11, $P^+$-type semiconductor region 12, gate insulating film 3 and second polycrystalline silicon layer 17, respectively. The second polycrystalline silicon layer 17 extends over the N-type well region 100 as, for example, the dummy word line $DWL_{1-2}$ shown in FIG. 4E. The aluminum layer 19 connected to the $P^+$-type semiconductor region 11 extends over the P-type semiconductor substrate 1 as, for example, the dummy data line $DL_{1-1}$ shown in FIG. 4E.

Although the MOS $Q_{D1}$ and $Q_{D2}$ in the dummy cell D-CEL have been exemplified as the P-channel type, N-channel type MOS $Q_{D1}$ and $Q_{D2}$ can be formed by changing all the aforecited conductivity types into the opposite conductivity types.

Layout Pattern of the Memory Array

Figure 9A:
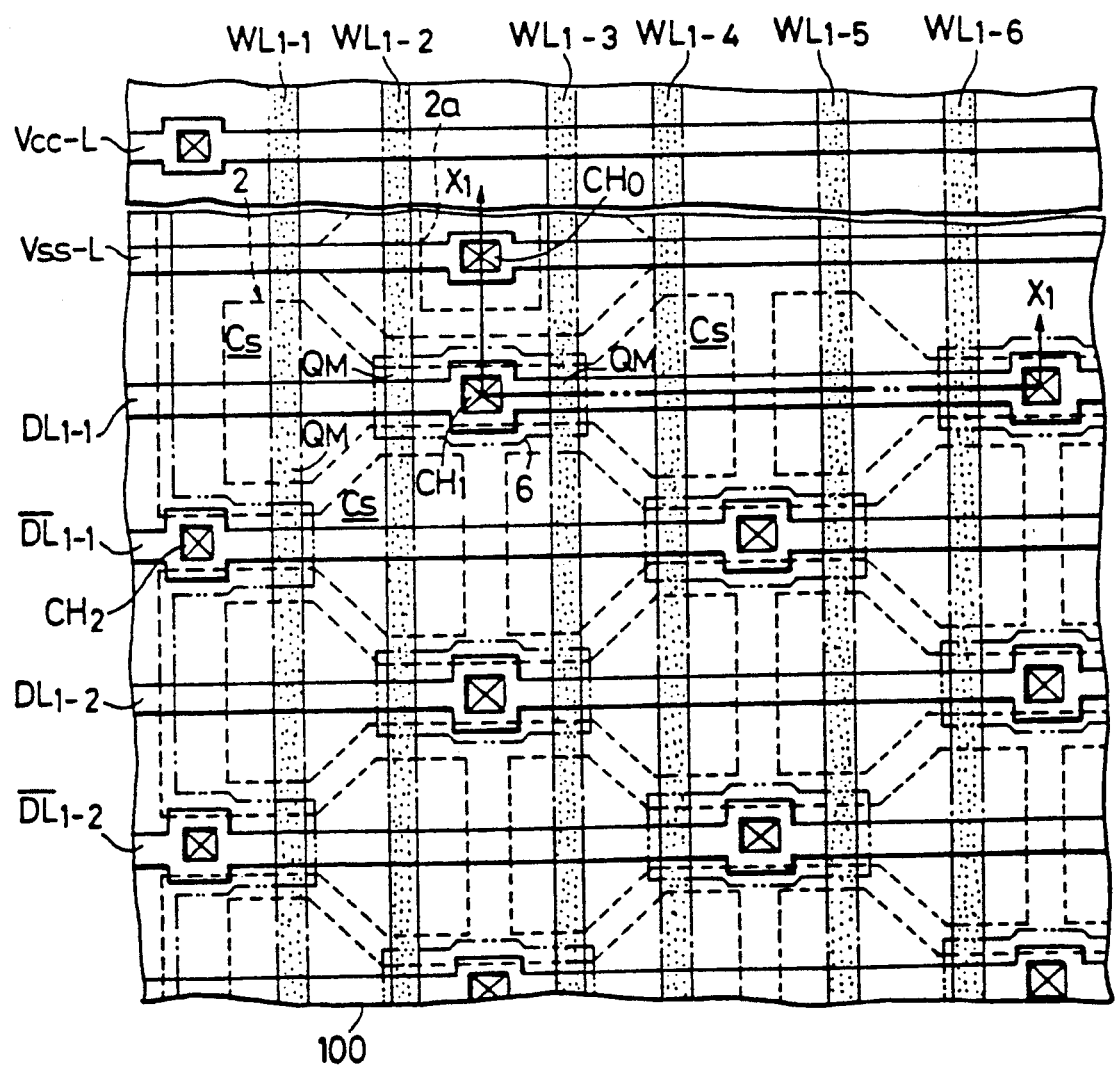
FIG. 9A is a layout pattern diagram of a memory array according to this invention.

The layout pattern of the memory array M-ARY will now be described with reference to FIG. 9A. The memory array M-ARY shown in FIG. 9A is an arrangement in which a plurality of memory cells M-CEL such as shown in FIG. 8 are arrayed in the N-type well region 100. First, the construction of the memory array M-ARY will be discussed.

Figure 9B:
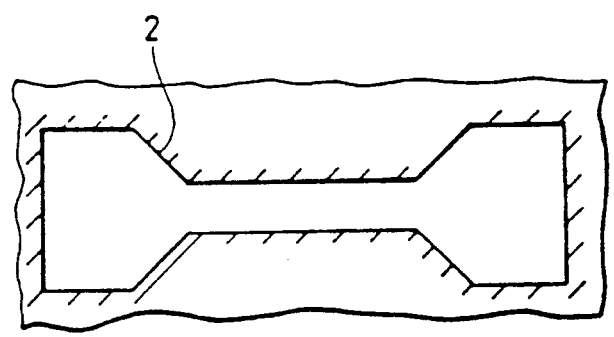
FIG. 9B is a pattern diagram of a field insulating film in a memory according to this invention.

In order to isolate each of the plurality of memory cells M-CEL from one another (where each cell is constructed of the MOS $Q_M$ and the storing capacitor $C_S$ in the surface of the N-type well region 100), the field insulating film 2 is formed in a basic pattern shown in FIG. 9B. A novel arrangement is also provided in that the field insulating film 2a is disposed under a contact hole $CH_0$ which permits the application of the ground voltage $V_{SS}$ to the first polycrystalline silicon layer 6. Accordingly, it is possible to prevent an aluminum-silicon alloy formed in the vicinity of the contact hole $CH_0$ on the basis of the interaction between the aluminum layer and the polycrystalline silicon layer from penetrating through the insulting film located directly below the contact hole $CH_0$ and undesirably reaching the surface of the N-type well region 100.

Figure 9C:
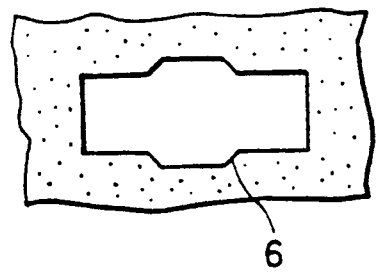
FIG. 9C is an electrode pattern diagram of a storing capacitor in a memory cell according to this invention.

On the field insulating film 2 and the gate insulating film 3, the first polycrystalline silicon layer 6 which is used as one electrode of the storing capacitor $C_S$ in the memory cell M-CEL is formed in a basic pattern shown in FIG. 9C. Further, on the first polycrystalline silicon layer 6, the word lines $WL_{1-1}$ - $WL_{1-6}$, each of which is formed by the second polycrystalline silicon layer 8 in FIG. 8A, extend in the vertical direction in FIG. 9A. Further, on the polycrystalline silicon layer 6 which serves as one electrode of the storing capacitor $C_S$, the power supply line $V_{SS}$-L for feeding the ground voltage $V_{SS}$ through the contact hole $CH_0$ extends in the lateral direction in FIG. 9A.

On the other hand, the data lines $DL_{1-1}$ and $\overline{DL_{1-1}}$, each of which is formed by the aluminum layer 10 in FIG. 8A, extend substantially in parallel with the power supply line $V_{SS}$-L as shown in FIG. 9A. The data line $DL_{1-1}$ is connected to the source region of the MOS $Q_M$ in one memory cell M-CEL through a contact hole $CH_1$, while the data line $\overline{DL_{1-1}}$ is connected to the source region of the MOS $Q_M$ in another memory cell M-CEL through a contact hole $CH_2$. In addition, the data lines $DL_{1-2}$ and $\overline{DL_{1-2}}$ extend in the lateral direction in FIG. 9A in the same manner as the data lines $DL_{1-1}$ and $\overline{DL_{1-1}}$, and they are connected to the source regions of the MOS $Q_M$ in memory cells M-CEL through contact holes in predetermined locations.

In order to bias the N-type well region 100 to the power source voltage $V_{CC}$, the power supply line $V_{CC}$-L extends at an end of the memory array M-ARY in the lateral direction in FIG. 9A and substantially in parallel with the data lines.

Layout Pattern of the Memory Array and the Dummy Array

Figure 9D:
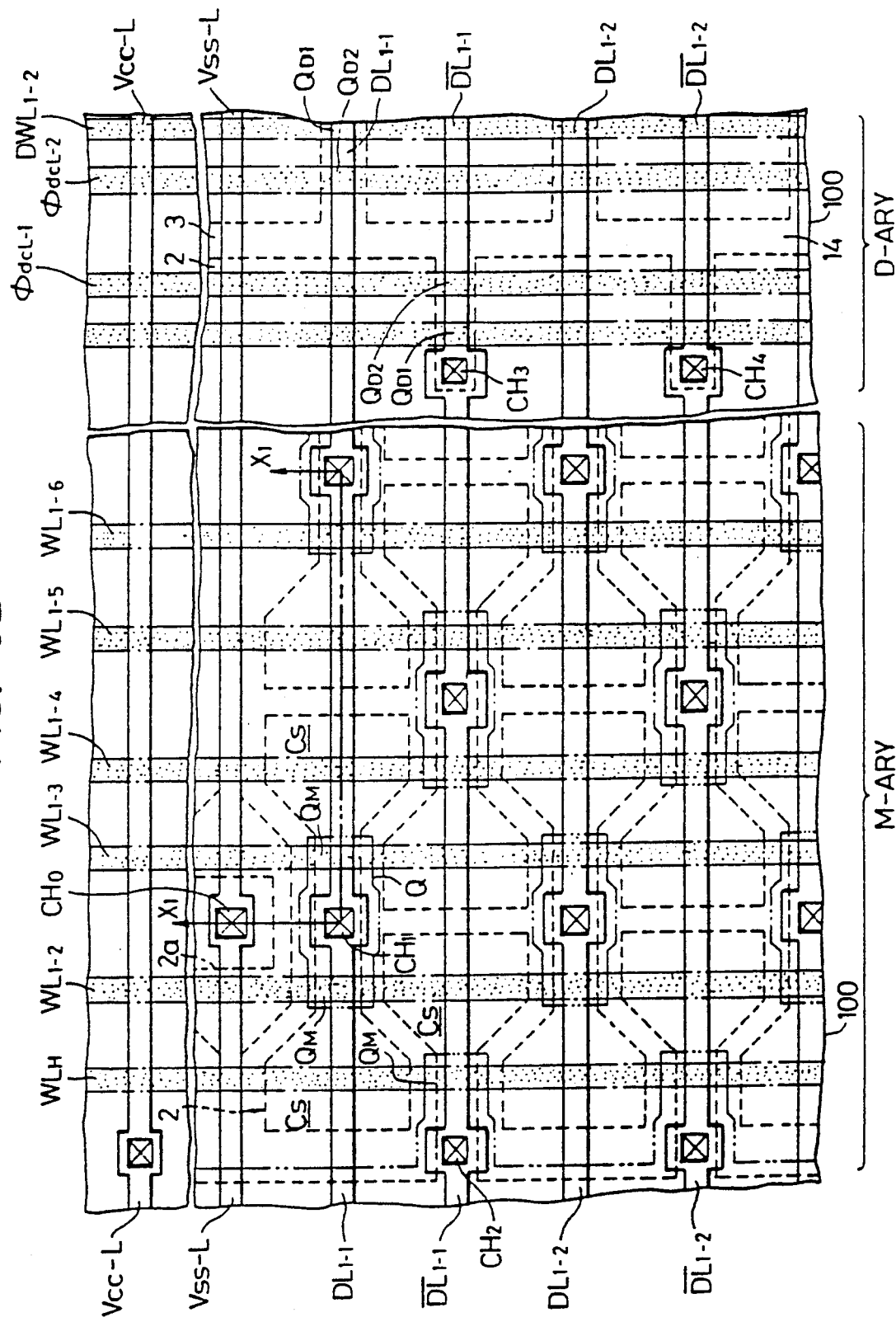
FIG. 9D is a layout pattern diagram of a memory array and a dummy array according to this invention.

The layout pattern of the memory array shown in FIG. 4E which includes the memory array M-ARY and the dummy array D-ARY is illustrated in FIG. 9D. Parts corresponding to those in FIG. 9A are assigned the same symbols. The difference between FIG. 9D and the layout pattern of FIG. 9A is that the dummy array D-ARY is added. A dummy cell D-CEL shown in FIG. 9D is constructed in the manner set forth below.

A part of the surface of the N-type well region 100 is covered with the field insulating film 2, while another part of the surface of the N-type well region 100 is covered with the gate insulating film 3. The $P^+$-type semiconductor region 14 is used as the common earth line of a plurality of dummy cells D-CEL.

The dummy word line $DWL_{1-1}$ is formed on the field insulating film by the second polycrystalline silicon layer 17 in FIG. 8B. The dummy word line $DWL_{1-1}$ constructs the gate electrode of the MOS $Q_{D1}$ in the dummy cell D-CEL. On the other hand, a control signal line $\phi_{dc}$-L1 which is formed by the second polycrystalline silicon layer 18 in FIG. 8B in order to apply the discharge control signal $\phi_{dc}$ illustrated in FIG. 4E is kept apart from the dummy word line $DWL_{1-1}$ and is extended in parallel therewith. This control signal line $\phi_{dc}$-L1 constructs the gate electrode of the MOS $Q_{D2}$ in the dummy cell D-CEL. Likewise, the dummy word line $DWL_{1-2}$ and a control signal line $\phi_{dc}$-L2 extend in parallel with the dummy word line $DWL_{1-1}$ and the control signal line $\phi_{dc}$-L1.

The data lines $DL_{1-1}$, $\overline{DL_{1-1}}$, $DL_{1-2}$ and $\overline{DL_{1-2}}$ extend from the memory array M-ARY to the dummy array D-ARY as shown in FIG. 9D. The $\overline{DL_{1-1}}$ is connected to the source region of the MOS $Q_{D1}$ in one dummy cell D-CEL through a contact hole $CH_3$, and the $\overline{DL_{1-2}}$ is similarly connected to the source region of the MOS $Q_{D1}$ in another D-CEL through a contact hole $CH_4$.

Manufacturing Process of the C-MOS Dynamic RAM

The manufacturing process of the dynamic RAM of the complementary type having the N-MOS and the P-MOS (hereinbelow, termed "C-MOS") construction will now be described with reference to FIGS. 10 to 35. In each of the figures, $X_1$ is a sectional process diagram of section $X_1$ - $X_1$ in the memory array M-ARY shown in FIG. 9A, while $X_2$ is a sectional process diagram of the C-MOS circuit portion of the sense amplifier $SA_2$ shown in FIG. 4A.

Step of Forming an Oxide Film

Figure 10:
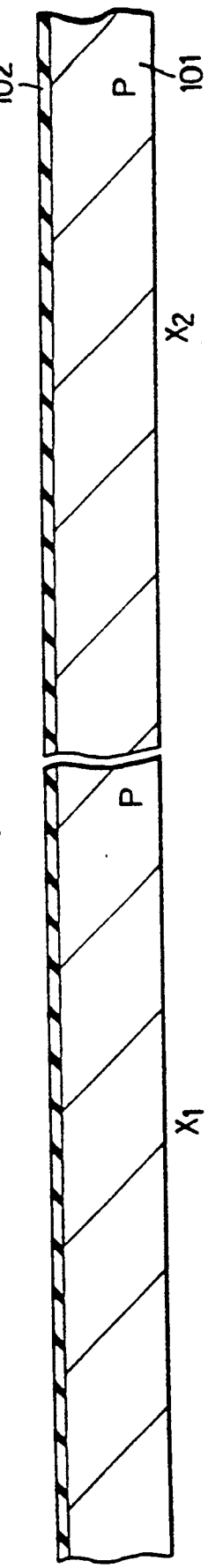

As shown in FIG. 10, an oxide film 102 is formed on the surface of a semiconductor substrate 101. The preferred materials for the semiconductor substrate 101 and the oxide film 102 are a P-type single-crystal silicon (Si) substrate having a (100) crystal face and a silicon dioxide ($SiO_2$) film.

Step of Selective Removal of the Oxide Film

Figure 11:
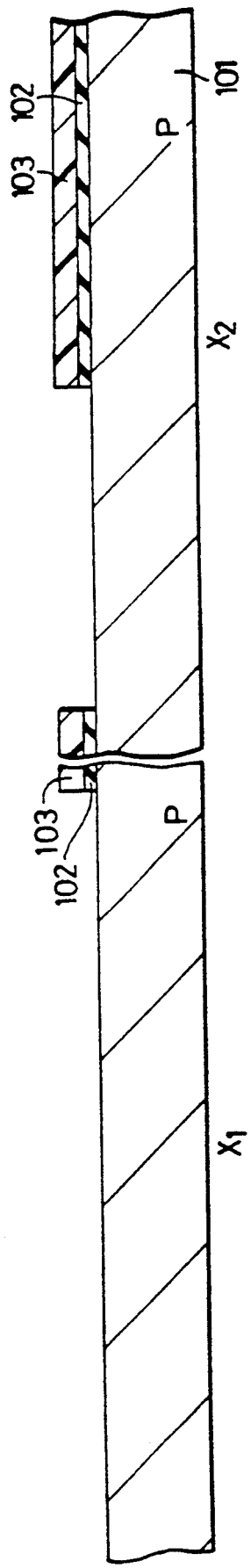

As shown in FIG. 11, in order to form well regions of the conductivity type opposite to that of the semiconductor substrate, those parts of the $SiO_2$ film 102 on the semiconductor substrate 101 which correspond to the well forming regions are removed. To this end, a silicon nitride ($Si_3N_4$) film 103 is first formed on selected areas of the surface of the $SiO_2$ film 102 as an etching mask. In this state, the $SiO_2$ film not covered with the $Si_3N_4$ film 103 is removed with an etchant.

Step of Selective Removal of the Substrate

Figure 12:
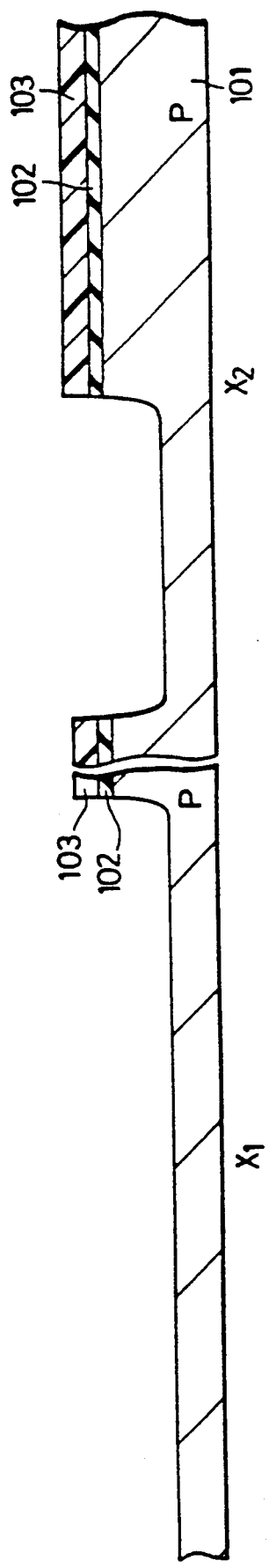

As shown in FIG. 12, in order to form the well regions of the conductivity type opposite to that of the semiconductor substrate 101 within this semiconductor substrate, the semiconductor substrate 101 is etched down to a desired depth by a wet etching process or a dry etching process by employing the $Si_3N_4$ film 103 as an etching mask using known techniques.

Step of Forming the N-type Well Regions

Figure 13:
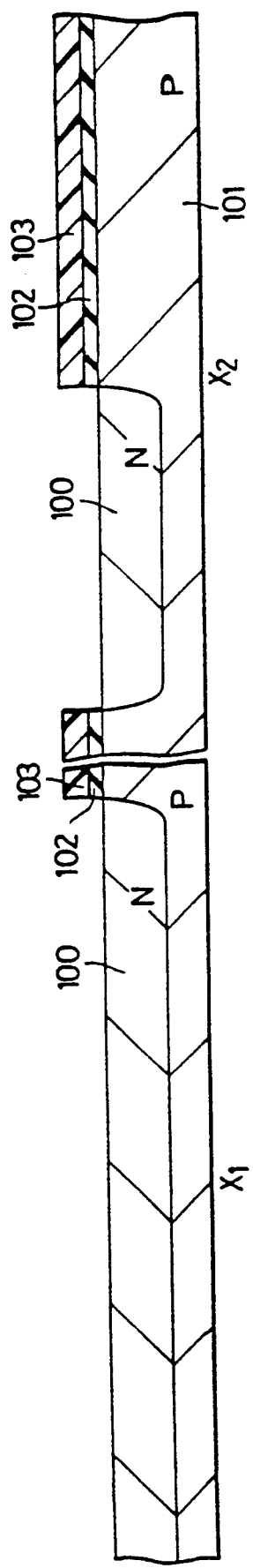

As shown in FIG. 13 the single crystal of Si is epitaxially grown using known techniques in each of the etched regions within the semiconductor substrate 101. Simultaneously, the Si crystal is doped with arsenic. In this way, the N-type well regions 100 having an impurity concentration of about $10^{15}$ cm$^{-3}$ are formed on the semiconductor substrate 101. Thereafter, the $SiO_2$ film 102 and the $Si_3N_4$ film 103 on the semiconductor substrate 101 are removed.

By forming the N-type well regions, certain advantages are achieved. For example, when the memory cell is constructed within the N-type well region, it is possible to prevent stored information from being inverted by the absorption of α-particles into the capacitor $C_S$ of the memory cell, since holes generated in and below the N-type well by the α-particles are reflected by the barrier of a P-N junction. Thus, the influence of the holes on the capacitor $C_S$ is avoided.

By epitaxially forming the well region, the following advantages are achieved over the case of forming it by diffusion:

(1) Since the impurity concentration of the well can be readily controlled, it can be made uniform.

(2) The junction capacitance in the well surface can be made low, and the speed of the memory operation becomes high.

(3) Since the impurity concentration in the well surface can be made low, the breakdown voltage increases.

(4) The control of the threshold voltage is facilitated.

(5) The depth of the well can be precisely adjusted.

Now, the steps of forming N-type well regions by another method will be described with reference to FIGS. 14 to 16.

Figure 14:
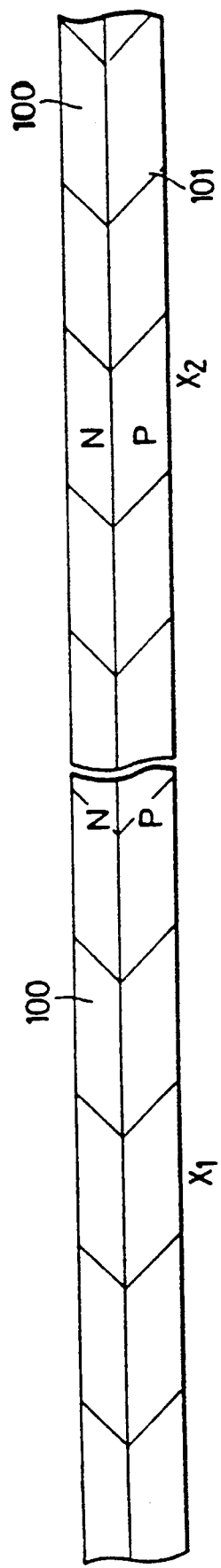

As shown in FIG. 14, a single crystal of Si is epitaxially grown on the whole surface of a semiconductor substrate 101 while it is being doped with arsenic. The impurity concentration of arsenic is $10^{15}$ cm$^{-3}$. Thus, an N-type well region approximately 3 μm deep is formed uniformly on the semiconductor substrate 101.

Figure 15:
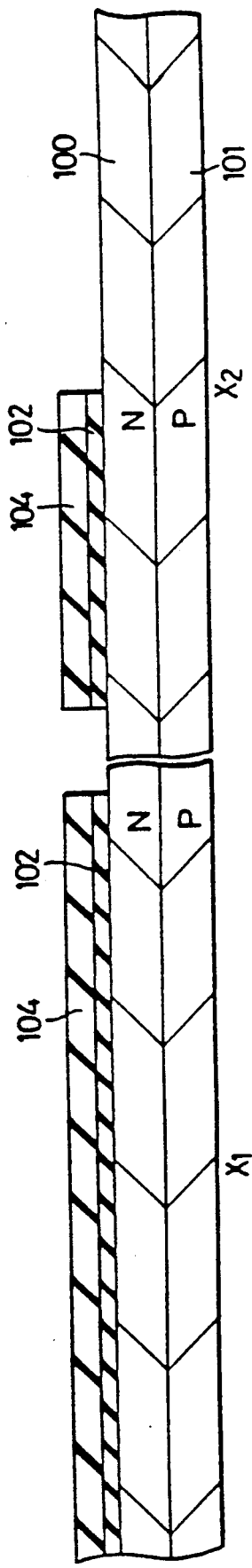

As shown in FIG. 15, in order to form desired N-type well regions, an $SiO_2$ film 102 and a photoresist film 104 ar formed on the N-type well forming regions. Thereafter, using the $SiO_2$ film 102 and the photoresist film 104 as a mask, boron at an impurity concentration of $2 \times 10^{15}$ cm$^{-3}$ is ion-implanted into the surface of the N-type well, whereupon thermal diffusion is executed to diffuse the boron and to form the same P-type regions as the semiconductor substrate 101.

As shown in FIG. 16, the $SiO_2$ film 102 and the photoresist film 104 are removed to form the desired N-type well regions within the semiconductor substrate 101.

It is to be understood that the process for forming the N-type well regions is not restricted to the two sorts of methods mentioned above, and that other methods may be resorted to if desired. Needless to say, the well regions may be formed by diffusion although, for the reasons set forth above, epitaxial growth is preferred.

Steps of Forming the Oxide Film and the Oxidation-Resisting Film

As shown in FIG. 17, an $SiO_2$ film 102 and an insulating film which does not let oxygen pass therethrough, that is, an oxidation-resisting film 103 are formed on the surfaces of the semiconductor substrate 101 and the N-type wells 100. As a preferred material for the oxidation-resisting film 103, a silicon nitride ($Si_3N_4$) film is used.

The $SiO_2$ film 102 is formed to a thickness of approximately 500 Å by the surface oxidation of the Si substrate for the following reason. When the $Si_3N_4$ film 103 is formed directly on the surface of the Si substrate 101, a thermal strain is placed on the surface of the Si substrate 101 due to the difference between the coefficients of thermal expansion of the Si substrate 101 and the $Si_3N_4$ film 103. In consequence, crystal defects are caused in the surface of the Si substrate 101. In order to prevent this drawback, the $SiO_2$ film 102 is formed on the surface of the Si substrate 101 before the formation of the $Si_3N_4$ film 103. On the other hand, the $Si_3N_4$ film 103 is used as a mask for the selective oxidation of the Si substrate 101 as will be described in detail later, and it is, therefore, formed to a thickness of approximately 1,400 Å by, for example, the CVD (Chemical Vapor Deposition) process.

Steps of Selective Removal of the Oxidation-Resisting Film and Ion Implantation In order to selectively remove the $Si_3N_4$ film 103 on those parts of the surface of the Si substrate 101 in which a comparatively thick insulating film (that is, a field insulating film) is to be formed, a photoresist film 104 is first formed on selected areas of the surface of the $Si_3N_4$ film 103 as an etching mask. Under this state, the exposed parts of the $Si_3N_4$ film 103 are removed by, for example, a plasma etching process capable of precise etching.

Subsequently, in order to prevent layers of the conductivity type opposite to that of the substrate (i.e., so-called inversion layers) from being formed in the surface parts of the Si substrate 101 in which the field insulating film is formed, an impurity of the same conductivity type as that of the substrate (e.g., a P-type impurity) is introduced into the Si substrate 101 through the SiO$_2$ film 102 exposed in the state in which the photoresist film 104 is left as shown in FIG. 18. As a process for the introduction of the P-type impurity, ion implantation is preferred. By way of example, ions of boron, which provide a P-type impurity, are implanted into the Si substrate 101 at an implantation energy of 75 keV. The dose of the ions at this time is $3 \times 10^{12}$ atoms/cm$^2$.

Step of Forming the Field Insulator

Figures 19, 20:
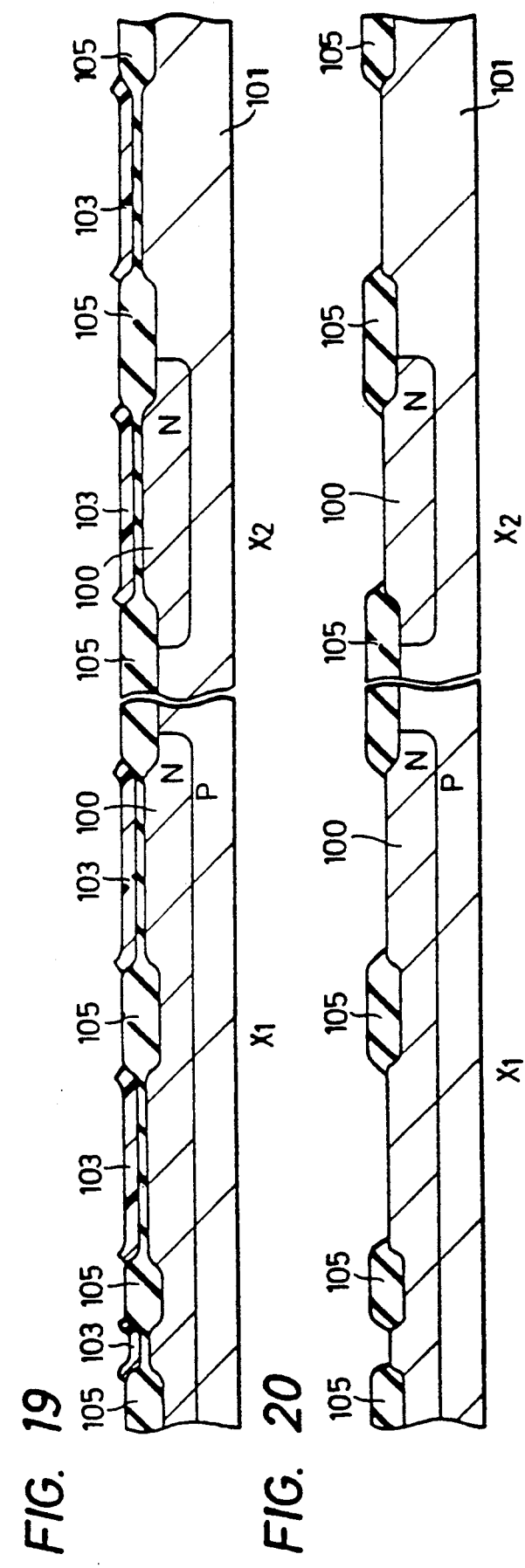

A field insulator 105 is formed on the selected areas of the surface of the Si substrate 101. More specifically, as shown in FIG. 19, after removing the photoresist film 104, the surface of the Si substrate 101 is selectively oxidized by thermal oxidation by employing the Si$_3$N$_4$ film 103 as a mask, and an SiO$_2$ film 105 approximately 9,500 Å thick (hereinafter, termed "field SiO$_2$ film") is formed. During the formation of the field SiO$_2$ film 105, the ion-implanted boron is brought into the Si substrate 101 by outdiffusion, so that P-type inversion-preventive layers (not shown) having a predetermined depth are formed directly below the field SiO$_2$ film 105.

Steps of Removing the Oxidation-Resisting Film and the Oxide Film

In order to expose those parts of the surface of the Si substrate 101 which are not covered with the field SiO$_2$ film 105, the Si$_3$N$_4$ film 103 is removed with, for example, a hot phosphoric acid (H$_3$PO$_4$) liquid. The SiO$_2$ film 102 is subsequently removed with, for example, a hydrofluoric acid (HF) liquid, to expose the selected areas of the surface of the Si substrate 101 as shown in FIG. 20.

Step of Forming the First Gate Insulating Film

Figure 21:
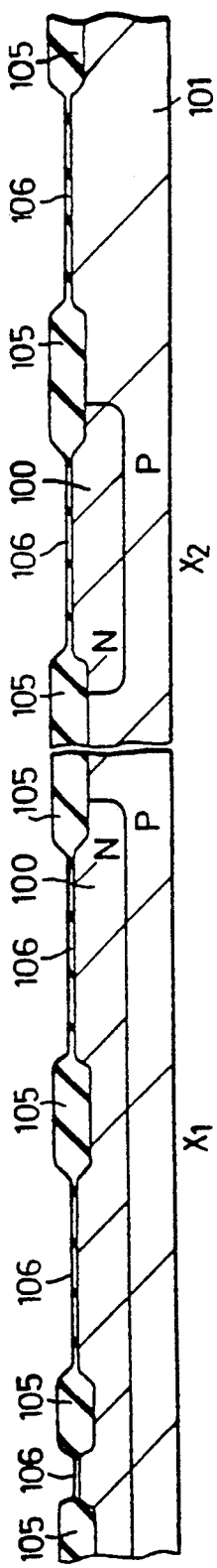

In order to obtain the dielectric layers of the capacitors C$_S$ in the memory cells M-CEL, the exposed surfaces of the Si substrate 101 and the N-type wells 100 are formed with a first gate insulating film 106 as shown in FIG. 21. That is, the exposed surfaces of the Si substrate 101 and the N-type wells are thermally oxidized, whereby the first gate insulating film 106 with a thickness of approximately 430 Å thick is formed in the surfaces. Accordingly, the first gate insulating film 106 is made of SiO$_2$.

Step of Depositing the First Conductor Layer

Figure 22:
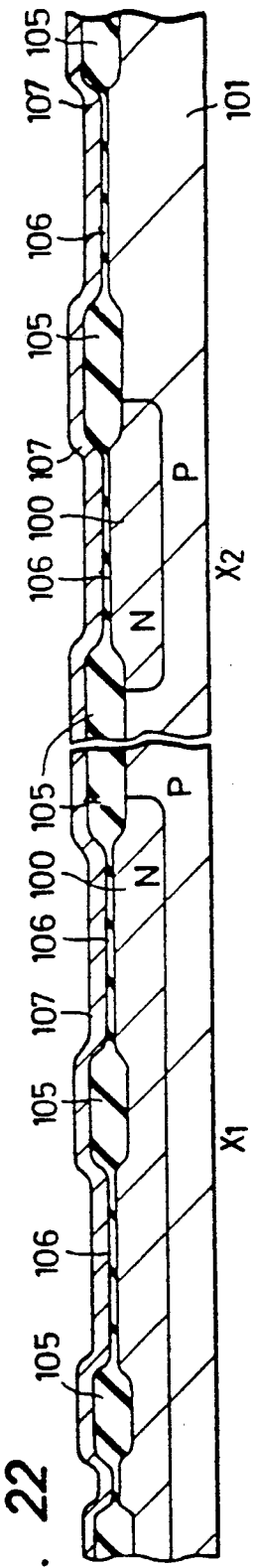

A first conductor layer 107 for use as one electrode of the capacitor C$_S$ in each memory cell is formed on the whole surface of the resultant Si substrate 101 as shown in FIG. 22. More specifically, a polycrystalline silicon layer, for example, is formed on the whole surface of the Si substrate 101 as the first conductor layer 107 by the CVD process. The thickness of the polycrystalline silicon layer is approximately 4,000 Å. Subsequently, in order to lower the resistance of the polycrystalline silicon layer 107, an N-type impurity, e.g., phosphorus is introduced into the polycrystalline silicon layer 107 by diffusion. As a result, the sheet resistance of the polycrystalline silicon layer 107 becomes approximately 16Ω per square.

Step of Selective Removal of the First Conductor Layer

Figure 23:
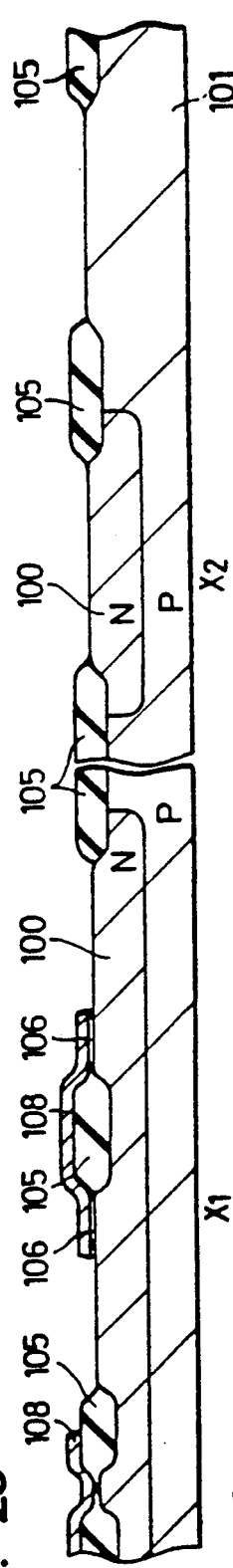

In order to form the first conductor layer or first polycrystalline silicon layer 107 into a predetermined electrode shape, the first polycrystalline silicon layer 107 is selectively removed by photoetching so as to form electrodes 108 as shown in FIG. 23. Plasma etching, which is capable of precise etching, is suitable as a process for selectively removing the first polycrystalline silicon layer 107. Subsequently, the exposed parts of the first gate SiO$_2$ film 106 are also etched to partially expose the surfaces of the N-type wells 100.

Step of Forming the Second Gate Insulating Film

Figure 24:
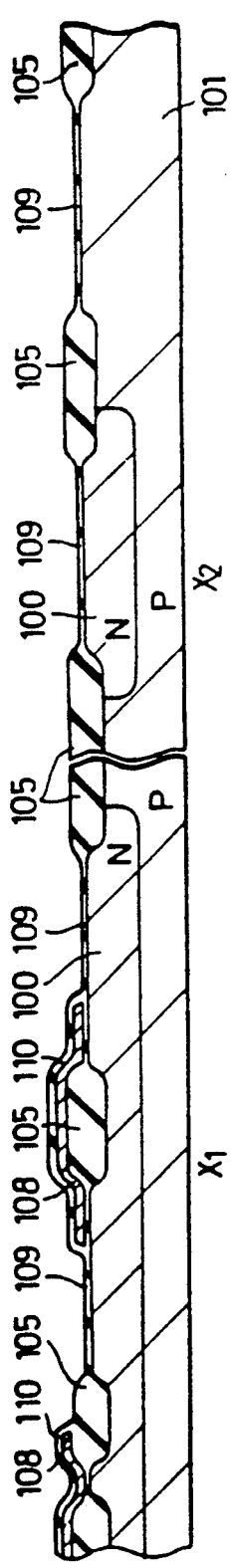

In order to obtain the gate insulating films of the MOSFETs in the memory array M-CEL, the dummy array D-CEL and the peripheral circuit portion, the exposed surfaces of the Si substrate 101 and the N-type wells 100 are covered with a second gate insulating film 109 as shown in FIG. 24. That is, the exposed surfaces of the Si substrate 101 and the N-type wells 100 Are thermally oxidized, whereby the second gate insulating film 109 with a thickness of approximately 530 Å is formed in the surfaces. Accordingly, the second gate insulating film 109 is made of SiO$_2$. Simultaneously with the formation of the second gate insulating film or second gate SiO$_2$ film 109, the surfaces of the electrodes 108 made of the first polycrystalline silicon are oxidized and are formed with SiO$_2$ films 110 which are approximately 2,200 Å thick. The SiO$_2$ film 110 serves for the inter-layer insulation between the electrode 108 and an electrode made of a second polycrystalline silicon layer to be described later.

Step of Ion Implantation for Controlling Threshold Voltage

As shown in FIG. 25, in order to control the threshold voltage of the N-MOS, a P-type impurity is introduced into that part of the surface of the Si substrate 101 in which the N-MOS is to be formed by ion implantation employing a photoresist film 104 over the surfaces of the N-type wells as a mask for the ion implantation. Boron, for example, is used as the P-type impurity. It is preferable that the implantation energy is 30 keV and that the dose of ions is $4.5 \times 10^{11}$ atoms/cm$^2$.

Step of Depositing the Second Conductor Layer

A second conductor layer 113 is formed on the whole surface of the resultant Si substrate 101 in order to use it as the gate electrodes for all the MOSFETs and the wiring layers. More specifically, as shown in FIG. 26, a polycrystalline silicon layer, for example, is formed on the entire surface of the Si substrate 101 as the second conductor layer 113 by a CVD process. The thickness of the polycrystalline silicon layer 113 is approximately 3,500 Å. Subsequently, in order to lower the resistance of the polycrystalline silicon layer 113, an N-type impurity, e.g., phosphorus is introduced into this polycrystalline silicon layer by diffusion. As a result, the sheet resistance of the polycrystalline silicon layer 113 becomes approximately 10Ω per square.

Step of Selective Removal of the Second Conductor Layer

The second conductor layer or second polycrystalline silicon layer 113 is selectively removed by photoetching in order to form it into a predetermined electrode or wiring shape. That is, as partially shown in FIG. 27 the photoetched silicon layer 113 forms the word lines $WL_{1-1}$ - $WL_{1-6}$, as well as dummy word lines $DWL_{1-1}$ and $DWL_{1-2}$ and control signal lines $\phi_{dc}$-L1 and $\phi_{dc}$-L2 shown in FIG. 9D. Further, the exposed second gate $SiO_2$ film 109 is removed to expose the surfaces of the Si substrate 101 and the N-type wells 100.

Step of Surface Passivation

In order to prevent the contamination of surface parts in which the source regions and drain regions of the MOSFETs are to be formed, the exposed surfaces of the Si substrate 101 and the N-type wells 100 are covered with an $SiO_2$ film 115 which is approximately 100 Å thick by the thermal oxidation thereof as illustrated in FIG. 28. Simultaneously with the formation of the $SiO_2$ film 115, the surfaces of the word lines $WL_{1-1}$ - $WL_{1-6}$, dummy word lines $DWL_{1-1}$ and $DWL_{1-2}$, control signal lines $\phi_{dc}$-L1 and $\phi_{dc}$-L2, and the gate electrodes of the complementary MOSFETs which are made of the second polycrystalline silicon are oxidized, with the result that the surfaces are covered with an $SiO_2$ film 116 about 300 Å thick, as also shown in FIG. 28.

Step of Forming Source and Drain Regions

In order to form the source and drain regions of the N-MOS in the selected portions of the Si substrate 101, as illustrated in FIG. 29, a mask for ion implantation, e.g., CVD $SiO_2$ film 119, is formed on the N-type wells 100. An N-type impurity, e.g., arsenic, is introduced into the Si substrate 101 through those areas of the $SiO_2$ film 115 which are not covered with the CVD $SiO_2$ film 119. As a process for introducing the N-type impurity, ion implantation is preferred. By way of example, arsenic ions are implanted into the Si substrate 101 at an implantation energy of 80 keV. The dose of the ions at this time is $1 \times 10^{16}$ atoms/cm$^2$. By subsequently performing a heat treatment, the ion-implanted arsenic impurity is subjected to outdiffusion, and $N^+$-type semiconductor regions 120 and 121 having a predetermined depth are formed. These $N^+$-type semiconductor regions 120 and 121 form the source and drain regions.

Next, in order to form the source and drain regions of the P-MOS in the selected parts of the N-type wells 100, as illustrated in FIG. 30, a mask for ion implantation, e.g., CVD $SiO_2$ film 119, is formed on the surface of the resultant Si substrate 101 except for the N-type wells 100. A P-type impurity, e.g., boron, is introduced into the N-type wells through the $SiO_2$ film 115 overlying the N-type wells 100 by ion implantation. By way of example, boron ions are implanted into the N-type wells at an implantation energy of 80 keV. The dose of the ions at this time is $3 \times 10^{15}$ atoms/cm$^2$.

By subsequently performing a heat treatment, the ion-implanted boron impurity is subjected to outdiffusion, and $P^+$-type semiconductor regions 122-127 having a predetermined depth are formed. These $P^+$-type semiconductor regions 122-127 form the source and drain regions.

It should be noted that the sources and drains of the P-MOS are preferably formed after the sources and drains of the N-type MISFETs so that the heat treatment step need only be carried out once. This will prevent the boron from diffusing more than is necessary.

Contact Hole Forming Step (1)

A contact hole for the connection between the first conductor layer or first polycrystalline silicon layer 108 and a third conductor layer to be discussed later is formed in the $SiO_2$ film 110. That is, as shown in FIG. 31, a contact hole $CH_{101}$ is formed in the selected part of the $SiO_2$ film 110 by employing a photoresist film (not shown) as a mask. This contact hole $CH_{101}$ corresponds to the contact hole $CH_0$ shown in FIG. 9A.

The reason why only the contact hole $CH_{101}$ for the connection between the first polycrystalline silicon layer 108 and the third conductor layer is formed is as follows. As stated before, the thickness of the $SiO_2$ film 110 formed in the surface of the first polycrystalline silicon layer 108 is 300 Å. On the other hand, the thickness of the $SiO_2$ film 115 formed in the surfaces of the Si substrate 101 and the N-type wells 100 is 100 Å. Accordingly, when these $SiO_2$ films 110 and 115 are etched at the same time, there is the possibility that the $SiO_2$ film 115 will be overetched before the first polycrystalline silicon film 108 is completely exposed. Therefore, in order to prevent this drawback, the contact hole $CH_{101}$ is formed independently as stated above.

Contact Hole Forming Step (2)

Contact holes for the connections between the source and drain regions and the third conductor layer are formed in the $SiO_2$ film 115. This is, using a predetermined mask, contact holes $CH_{102}$–$CH_{107}$ are formed as shown in FIG. 32 by the selective etching of the $SiO_2$ film 115. The contact hole $CH_{102}$ corresponds to the contact hole $CH_1$ in FIG. 9A.

It should be noted that although the mask includes an opening at a location corresponding to the contact hole $CH_{101}$, the overetch of the $SiO_2$ film 110 in the contact hole $CH_{101}$ does not create a problem in actual practice.

Step of Forming the Inter-Layer Insulating Film

Figure 33:
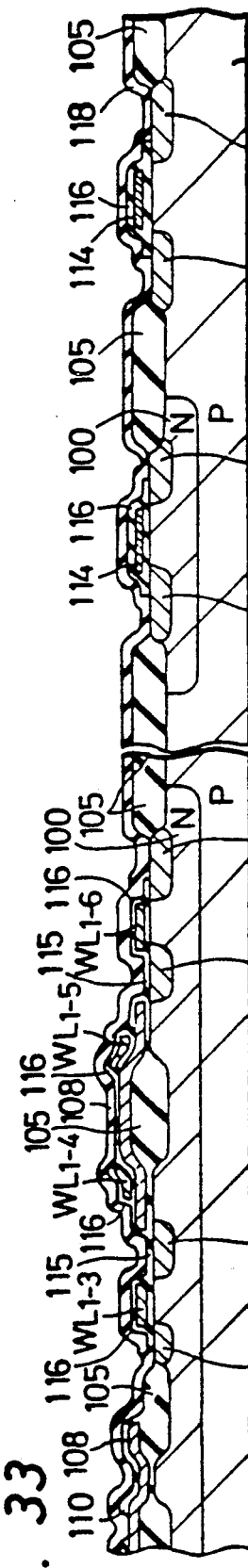

An inter-layer insulating film is formed on the whole surface of the resultant Si substrate 101. That is, as illustrated in FIG. 33, an inter-layer insulating film 118, for example, a phosphosilicate glass (PSG) film, which is approximately 8,000 Å thick is formed on the entire surface of the Si substrate 101. This PSG film 118 serves also as a getter for sodium ions which affect the characteristics of the MOS.

Contact Hole Forming Step (3)

Contact holes are formed in the PSG film 118 for the connections between the second polycrystalline silicon layer and the third conductor layer as well as between the source and drain regions and the third conductor layer.

Figure 34:
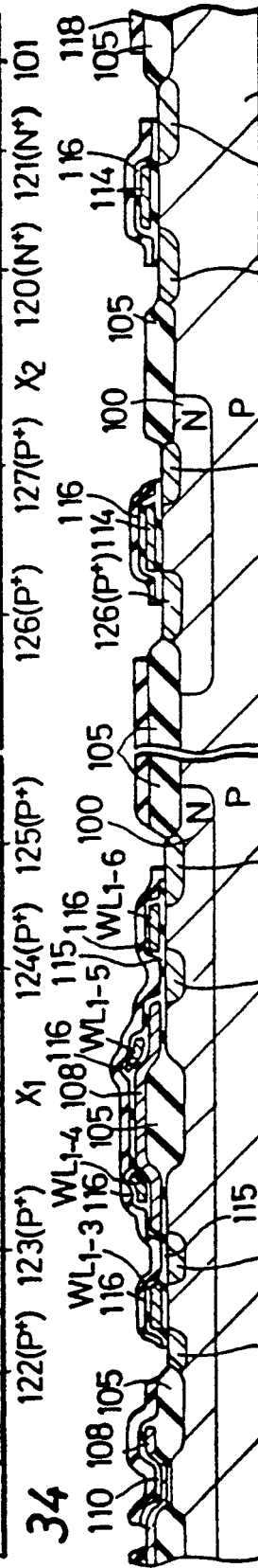

As shown in FIG. 34, the PSG film 118 is selectively etched to form contact holes $CH_{101}$–$CH_{107}$ at the same locations as shown in FIG. 32. A mask which is used in forming these contact holes $CH_{101}$–$CH_{107}$ is the same as the mask used for forming the contact holes $CH_{101}$–$CH_{107}$ in the contact hole forming step (2). Subsequently, the PSG film 118 is heat-treated at a temperature of about 1,000° C. in order to flatten it.

It is also possible that the formation of the contact holes into the $SiO_2$ film 115 explained in the contact hole forming step (2) is achieved simultaneously with the formation of the contact holes into the PSG film 118. However, while the contact holes in the $SiO_2$ film 115 are being formed, the PSG film 118 is also etched.

In other words, an overetch of the PSG film 118 occurs. In order to prevent the overetch, accordingly, it is preferable that the formation of the contact holes into the PSG film 118 and the formation of the contact holes into the SiO$_2$ film 115 are separately executed as described above.

Step of Forming the Third Conductor Layer

Figure 35:
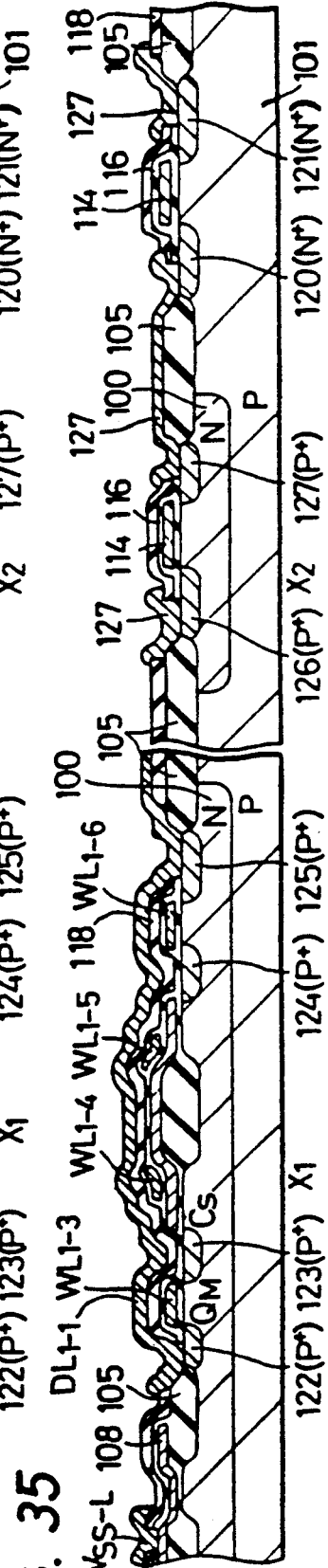

In order to form the power supply lines V$_{SS}$-L and the data lines DL$_{1-1}$, $\overline{DL_{1-1}}$, DL$_{1-2}$ and $\overline{DL_{1-2}}$ shown in FIG. 9A, the third conductor layer, e.g., an aluminum layer which is approximately 12,000 Å thick, is first formed on the whole surface of the resultant Si substrate 101. Subsequently, this aluminum layer is selectively etched to form a power supply line V$_{SS}$-L, a data line DL$_{1-1}$ and a wiring layer 127, as illustrated in FIG. 35.

The D-RAM according to the present invention s thus far described has the following advantages:

(1) Since a plurality of N-type well regions formed by an identical process are disposed in a P-type semiconductor substrate, and P-channel MISFETs serving as memory cells and a pair of P-channel FETs of a complementary sense amplifier are formed in the surfaces of the respective well regions, memory cells which are substantially immune to α-particles and a stable, high speed sense amplifier are simultaneously obtained. In this regard, by constructing the memory cell of P-MOSFETs and varying a word voltage within a range between a power source voltage V$_{cc}$ and (V$_{cc}$-|V$_{thp}$|), the selection of information "1" or "0" is permitted, and a memory capable of operating at high speed is obtained.

(2) Since a complementary sense amplifier is connected to folded data lines, an areal margin in layout which is approximately double that found in prior art devices is obtained. Hence, a high packaging density becomes possible.

(3) Since means for precharging folded data lines to a potential intermediate between the logics "1" and "0" of a memory cell is provided, the change of the potential of a data line equal to half of the potential difference between the logics "1" and "0" determines the read-out time. Hence, a memory of high speed and low power dissipation is obtained.

In addition, the coupling noise of a word line and the data line are cancelled because plus and minus noise develop in the folded data lines respectively.

Further, since the data line is precharged with a reference potential at a level intermediate between the logics "1" and "0" of the memory cell, a dummy cell can be dispensed with, and a memory of small chip area is obtained.

(4) Since the starting times of the positive feedback operation of the P-channel FET pair of a sense amplifier and the positive feedback operation of the N-channel FET pair thereof are made different, through-current does not flow, and a memory of low power dissipation is obtained.

(5) Since the P-channel FET pair and N-channel FET pair of a complementary sense amplifier are arranged at both the ends of a memory array, the layout within a chip can be separated into the group of P-channel FETs and the group of N-channel FETs, and hence, efficient packaging is permitted.

(6) Since folded data lines are formed of Al, the wiring resistance is very low, and an operation of high reliability is permitted.

(7) Since an N-type well region for forming memory cells therein is made of an epitaxial layer, a uniform well having a desired impurity concentration can be obtained. Therefore, a threshold voltage can be controlled and a junction capacitance can be made lower than in a case where diffusion is used. This improves the high speed capabilities of the memory. In addition, the surface impurity concentration of the well can be made lower than in the case of diffusion, so that a memory having breakdown voltage is obtained.

(8) Since a plurality of N-type well regions are formed with well biasing wirings in parallel with data lines, well voltages become substantially uniform and well resistances can be made low. Thus, a memory is produced which is relatively immune to noise.

(9) When the D-RAM is laid out so as to isolate a well region for forming memory cells therein and a well region for forming a sense amplifier therein, noise which has developed in the sense amplifier has no influence on the memory cells. Hence, an operation of high reliability becomes possible.

It is to be understood that the above-described arrangements are simply illustrative of the application of the principles of the invention. Numerous other arrangements may be readily devised by those skilled in the art which embody the principles of the invention and fall within its spirit and scope.

We claim:

1. A semiconductor memory formed in a semiconductor integrated circuit comprising:

a pair of data lines disposed substantially parallel and adjacent to each other;

a plurality of word lines, each of which is arranged so as to intersect with both of said pair of data lines;

a plurality of memory cells, each of which is coupled to one of said word lines and one of said pair of data lines at the cross point thereof;

selecting means coupled to said plurality of word lines including means for placing one of said plurality of word lines in a selected state;

amplifier means coupled to said pair of data lines for amplifying a potential difference which appears between said data lines, said amplifier comprising first and second circuits;

said first circuit including a pair of cross-coupled N-channel MISFETs coupled to said pair of data lines for bringing about a differential amplification operation; and said second circuit including a pair of cross-coupled P-channel MISFETs coupled to said pair of data lines for bringing about a differential amplification operation, wherein the differential amplification operation of said cross-coupled N-channel MISFETs is started at a time different from the time when the differential amplification operation of said cross-coupled P-channel MISFETs is started.

2. A semiconductor memory according to claim 1, further comprising a first terminal coupled to a source side of said cross-coupled N-channel MISFETs and supplied with a first reference voltage and a second terminal coupled to a source side of said cross-coupled P-channel MISFETs and supplied with a second reference voltage.

3. A semiconductor memory according to claim 2, wherein the differential amplification operation of said cross-coupled N-channel MISFETs is started in response to said first reference voltage being supplied to said source side of said cross-coupled N-channel MISFETs, and wherein the differential amplification operation of said cross-coupled P-channel MISFETs is started in response to said second reference voltage being supplied to said source side of said cross-coupled P-channel MISFETs.

4. A semiconductor memory according to claim 3, further comprising precharging means for setting said pair of data lines at a potential intermediate between said first reference voltage and said second reference voltage.

5. A semiconductor memory according to claim 4, wherein said intermediate potential corresponds to a potential intermediate between binary signal levels to be stored in the memory cells.

6. A semiconductor memory comprising:
a pair of data lines which extend substantially in parallel to each other;
a plurality of word lines, each of which is arranged so as to intersect with both of said pair of data lines;
a plurality of memory cells, each of which is coupled to one of said word lines and one of said data lines; and
a sense amplifier for amplifying a difference between signal levels appearing on said pair of data lines when a stored signal of one of said memory cells is read out, said amplifier comprising first and second circuits,
wherein said first circuit is coupled to a first end side of said pair of data lines while said second circuit is coupled to a second end side of said pair of data lines opposite said first end side so that said memory cells are located between said first and second circuits, and
wherein said first circuit includes a pair of cross-coupled N-channel transistors, and wherein said second circuit includes a pair of cross-coupled P-channel transistors,
further including:
a first MISFET coupled on a source side of said cross-coupled N-channel transistors for controlling a differential amplification operation of said cross-coupled N-channel transistors; and
a second MISFET coupled on a source side of said cross-coupled P-channel transistors for controlling a differential amplification operation of said cross-coupled P-channel transistors.

7. A semiconductor memory comprising:
a pair of data lines which extend substantially in parallel to each other;
a plurality of word lines, each of which is arranged so as to intersect with both of said pair of data lines;
a plurality of memory cells, each of which is coupled to one of said word lines and one of said data lines; and
a sense amplifier for amplifying a difference between signal levels appearing on said pair of data lines when a stored signal of one of said memory cells is read out, said amplifier comprising first and second circuits,
wherein said first circuit is coupled to a first end side of said pair of data lines while said second circuit is coupled to a second end side of said pair of data lines opposite said first end side so that said memory cells are located between said first and second circuits, and
wherein said first circuit includes a pair of N-channel MISFETs, each of which has a gate terminal coupled to a drain terminal of the other MISFET of said pair of N-channel MISFETs and the drain terminal coupled to one of said pair of data lines, and wherein said second circuit includes a pair of P-channel MISFETs, each of which has a gate terminal coupled to a drain terminal of the other MISFET of said pair of P-channel MISFETs and the drain terminal coupled to one of said pair of data lines.

8. A semiconductor memory according to claim 7, further including:
a first MISFET coupled on a source side of said pair of N-channel MISFETs for controlling a differential amplification operation of said pair of N-channel MISFETs; and
a second MISFET coupled on a source side of said pair of P-channel MISFETs for controlling a differential amplification operation of said pair of P-channel MISFETs.

9. A semiconductor memory comprising:
a memory cell array having a plurality of pairs of data lines which extend between opposite end areas of said memory cell array, a plurality of word lines which extend in a direction traversing said plurality of pairs of data lines, and a plurality of memory cells arrayed in association with said data and word lines; and
a plurality of sense amplifiers, each of which is coupled to each pair of data lines for amplifying a difference between signal levels appearing on the pair of data lines,
wherein said each sense amplifier includes a pair of N-channel MISFETs coupled to said pair of data lines formed in one end area of said memory cell array and a pair of P-channel MISFETs coupled to said pair of data lines formed in the other end area of said memory cell array, and
wherein each one of said N-channel MISFETs has a gate terminal coupled to a drain terminal of the other MISFET of said pair of N-channel MISFETs and the drain terminal coupled to one of said pair of data lines, and wherein each one of said P-channel MISFETs has a gate terminal coupled to a drain terminal of the other MISFET of said pair of P-channel MISFETs and the drain terminal coupled to one of said pair of data lines.

10. A semiconductor memory comprising:
a pair of data lines which extend substantially in parallel to each other;
a plurality of word lines traversing said pair of data lines;
a pair of N-channel MISFETs and a pair of P-channel MISFETs coupled by connecting nodes to said pair of data lines, respectively, for amplifying a difference between signal levels appearing on said pair of data lines; and
a plurality of memory cells, each of which is coupled by connecting nodes to one of said word lines and one of said data lines;
wherein connecting nodes of said plurality of memory cells and said data lines are arranged between connecting nodes of said N-channel MISFETs and said data lines and connecting nodes of said P-channel MISFETs and said data lines, and
wherein each one of said N-channel MISFETs has a gate terminal coupled to a drain terminal of the other MISFET of said pair of N-channel MISFETs and a drain terminal coupled to one of said pair of data lines, and wherein each one of said P-channel MISFETs has a gate terminal coupled to a drain terminal of the other MISFET of said pair of P-channel MISFETs and a drain terminal coupled to one of said pair of data lines.

11. A semiconductor memory according to claim 3, further comprising an N-channel MISFET coupled between said first terminal and said first reference voltage for controlling the differential amplification operation of said cross-coupled N-channel MISFETs, and a P-channel MISFET coupled between said second terminal and said second reference voltage for controlling the differential amplification operation of said cross-coupled P-channel MISFETs.

12. A semiconductor memory according to claim 5, further comprising an N-channel MISFET coupled between said first terminal and said first reference voltage for controlling the differential amplification operation of said cross-coupled N-channel MISFETs, and a P-channel MISFET coupled between said second terminal and said second reference voltage for controlling the differential amplification operation of said cross-coupled P-channel MISFETs.

13. A semiconductor memory according to claim 9, wherein said N-channel MISFETs of each of said sense amplifiers are coupled to the corresponding pair of data lines to bring about a differential amplification operation, wherein said P-channel MISFETs of each of said sense amplifiers are coupled to the corresponding pair of data lines to bring about a differential amplification operation, and wherein the differential amplification operation of said N-channel MISFETs is started at a time different from the time when the differential amplification operation of said P-channel MISFETs is started.

14. A semiconductor memory according to claim 10, wherein said pair of N-channel MISFETs are coupled to the pair of data lines to bring about a differential amplification operation, wherein said pair of P-channel MISFETs are coupled to the pair of data lines to bring about a differential amplification operation, and wherein the differential amplification operation of said N-channel MISFETs is started at a time different from the time when the differential amplification operation of said P-channel MISFETs is started.

15. A semiconductor memory according to claim 13, further comprising a first terminal coupled to a source side of said N-channel MISFETs and supplied with a first reference voltage and a second terminal coupled to a source side of said P-channel MISFETs and supplied with a second reference voltage.

16. A semiconductor memory according to claim 15, wherein the differential amplification operation of said N-channel MISFETs is started in response to said first reference voltage being supplied to said source side of said N-channel MISFETs, and wherein the differential amplification operation of said P-channel MISFETs is started in response to said second reference voltage being supplied to said source side of said P-channel MISFETs.

17. A semiconductor memory according to claim 16, further comprising precharging means for setting said pairs of data lines at a potential intermediate between said first reference voltage and said second reference voltage.

18. A semiconductor memory according to claim 17, wherein said intermediate potential corresponds to a potential intermediate between binary signal levels to be stored in the memory cells.

19. A semiconductor emory according to claim 16, further comprising an additional N-channel MISFET coupled between said first terminal and said first reference voltage for controlling the differential amplification operation of said N-channel MISFETs, and an additional P-channel MISFET coupled between said second terminal and said second reference voltage for controlling the differential amplification operation of said P-channel MISFETs.

20. A semiconductor memory according to claim 14, further comprising a first terminal coupled to a source side of said N-channel MISFETs and supplied with a first reference voltage and a second terminal coupled to a source side of said P-channel MISFETs and supplied with a second reference voltage.

21. A semiconductor memory according to claim 20, wherein the differential amplification operation of said N-channel MISFETs is started in response to said first reference voltage being supplied to said source side of said N-channel MISFETs, and wherein the differential amplification operation of said P-channel MISFETs is started in response to said second reference voltage being supplied to said source side of said P-channel MISFETs.

22. A semiconductor memory according to claim 21, further comprising precharging means for setting said pair of data lines at a potential intermediate between said first reference voltage and said second reference voltage.

23. A semiconductor memory according to claim 22, wherein said intermediate potential corresponds to a potential intermediate between binary signal levels to be stored in the memory cells.

24. A semiconductor memory according to claim 21, further comprising an additional N-channel MISFET coupled between said first terminal and said first reference voltage for controlling the differential amplification operation of said N-channel MISFETs, and an additional P-channel MISFET coupled between said second terminal and said second reference voltage for controlling the differential amplification operation of said P-channel MISFETs.

* * * * *

UNITED STATES PATENT AND TRADEMARK OFFICE
CERTIFICATE OF CORRECTION

PATENT NO. : 5,119,332
DATED : June 2, 1992
INVENTOR(S) : K. SHIMOHIGASHI et al.

It is certified that error appears in the above-indentified patent and that said Letters Patent is hereby corrected as shown below:

On the title page, item [75], add --Kunihiko Ikuzaki, Hinode, Japan.

Signed and Sealed this

Thirteenth Day of September, 1994

Attest:

BRUCE LEHMAN

*Attesting Officer*     *Commissioner of Patents and Trademarks*